US010684331B2

(12) United States Patent
Hegedus

(10) Patent No.: US 10,684,331 B2
(45) Date of Patent: Jun. 16, 2020

(54) CURRENT SENSOR POSITIONING ERROR CORRECTION USING AUXILIARY HALL CELLS

(71) Applicant: Infineon Technologies AG, Neubiberg (DE)

(72) Inventor: Akos Hegedus, Villach (AT)

(73) Assignee: Infineon Technologies AG, Neubiberg (DE)

( * ) Notice: Subject to any disclaimer, the term of this patent is extended or adjusted under 35 U.S.C. 154(b) by 164 days.

(21) Appl. No.: 15/875,364

(22) Filed: Jan. 19, 2018

(65) Prior Publication Data
US 2018/0143268 A1 May 24, 2018

Related U.S. Application Data

(63) Continuation of application No. 14/597,888, filed on Jan. 15, 2015, now Pat. No. 9,880,234.

(51) Int. Cl.
| | |
|---|---|
| *G01R 19/00* | (2006.01) |
| *G01R 33/00* | (2006.01) |
| *G01R 33/07* | (2006.01) |
| *G01R 15/20* | (2006.01) |

(52) U.S. Cl.
CPC .......... *G01R 33/072* (2013.01); *G01R 15/20* (2013.01); *G01R 19/00* (2013.01); *G01R 33/0094* (2013.01); *G01R 33/07* (2013.01)

(58) Field of Classification Search
None
See application file for complete search history.

(56) References Cited

U.S. PATENT DOCUMENTS

| | | | |
|---|---|---|---|
| 8,319,491 B2 | 11/2012 | Hammerschmidt | |
| 8,461,824 B2 | 6/2013 | Ausserlechner | |
| 8,878,531 B2 | 11/2014 | Ausserlechner | |
| 8,963,536 B2 | 2/2015 | Ausserlechner | |
| 9,476,915 B2 | 10/2016 | Ausserlechner | |
| 9,733,280 B2 * | 8/2017 | Hegedus | G01R 15/207 |
| 9,880,234 B2 | 1/2018 | Hegedus | |
| 2010/0156394 A1 | 6/2010 | Ausserlechner | |

(Continued)

OTHER PUBLICATIONS

Infineon, "TL14970—Current Sensor Family", www.infineon.com/current-sensor, Order No. B142-H9771-G3-X-7600, Feb. 2014, 2 pages.

(Continued)

*Primary Examiner* — Jermele M Hollington
(74) *Attorney, Agent, or Firm* — Harrity & Harrity, LLP

(57) ABSTRACT

A current sensor may comprise a first Hall cell, a second Hall cell, a third Hall cell, a fourth Hall cell, and a fifth Hall cell to a set of magnetic field values associated with a magnetic field generated by a current passing through a current rail. The second Hall cell may be positioned at a first distance from the first Hall cell, and the third Hall cell may be positioned at a second distance from the first Hall cell such that the third Hall cell is positioned between the first Hall cell and the second Hall cell. The fourth Hall cell may be positioned adjacent to the first Hall cell, and the fifth Hall cell may be positioned at a third distance from the fourth Hall cell. The magnetic field values may be used to determine an amount of current associated with the current passing through the current rail.

20 Claims, 25 Drawing Sheets

(56) References Cited

U.S. PATENT DOCUMENTS

| | | | |
|---|---|---|---|
| 2012/0126805 A1 | 5/2012 | Ausserlechner | |
| 2012/0262152 A1 | 10/2012 | Ausserlechner | |
| 2014/0266180 A1* | 9/2014 | Ausserlechner | G01R 15/20 324/251 |
| 2016/0209479 A1* | 7/2016 | Hegedus | G01R 33/07 |
| 2019/0128972 A1* | 5/2019 | Raghavan | G01R 33/07 |
| 2019/0386206 A1* | 12/2019 | Schaller | H01L 23/057 |

OTHER PUBLICATIONS

Infineon, "Sensor Solutions for Automotive and Industrial Applications", www.infineon.com/sensors, Order No. B142-H9759-G1-X-7600, http://www.infineon.com/dgdl/InfineonSensor_Solutions_for_Automotive_and_Industrial-BR-v1.0en.pdf?fileId=db3a30433a047ba0013a4f37abc84020, May 2014, 40 pages.

\* cited by examiner

CURRENT SENSOR POSITIONING ERROR CORRECTION USING AUXILIARY HALL CELLS

RELATED APPLICATION

This application is a continuation of U.S. patent application Ser. No. 14/597,888, filed Jan. 15, 2015 (now U.S. Pat. No. 9,880,234), the disclosure of which is incorporated herein by reference.

BACKGROUND

A magnetic current sensor may determine an amount of current based on sensing a magnetic field, generated by the current, and based on the fact that the generated magnetic field is proportional to the amount of current. Since no galvanic coupling is needed, voltage isolation between a low voltage signal processing circuit and a high voltage current rail is possible up to several kilovolts.

SUMMARY

According to some possible implementations, a magnetic current sensor may comprise: a first primary Hall cell to sense a first magnetic field value, where the first magnetic field value may be associated with a magnetic field generated by a current passing through a current rail; a second primary Hall cell to sense a second magnetic field value, where the second magnetic field value may be associated with the magnetic field generated by the current passing through the current rail, and where the second primary Hall cell may be positioned along an axis at a first distance from the first primary Hall cell, where the axis may be in a direction substantially perpendicular to the current passing through the current rail; and an auxiliary Hall cell to sense a third magnetic field value, where the auxiliary Hall cell may be positioned along the axis at a second distance from the first primary Hall cell, where the second distance may be less than the first distance such that the auxiliary Hall cell is positioned along the axis and between the first primary Hall cell and the second primary Hall cell, and where the first magnetic field value, the second magnetic field value, and the third magnetic field value may be used to determine an amount of current associated with the current passing through the current rail.

According to some possible implementations, a magnetic current sensor, may comprise: a first primary Hall cell to sense a first magnetic field value, where the first magnetic field value may be associated with a magnetic field generated by a current passing through a current rail; a second primary Hall cell to sense a second magnetic field value, where the second magnetic field value may be associated with the magnetic field generated by the current passing through the current rail, and where the second primary Hall cell may be positioned along an axis at a first distance from the first primary Hall cell, where the axis may be in a direction substantially perpendicular to the current passing through the current rail; a first auxiliary Hall cell to sense a third magnetic field value, where the third magnetic field value may be associated with the magnetic field generated by the current passing through the current rail, where the first auxiliary Hall cell may be positioned adjacent to the first primary Hall cell in a direction substantially parallel to a direction of the current; and a second auxiliary Hall cell to sense a fourth magnetic field value, where the fourth magnetic field value may be associated with the magnetic field generated by the current passing through the current rail, where the second auxiliary Hall cell may be positioned along the axis at a second distance from the first auxiliary Hall cell in a direction substantially perpendicular to the current passing through the current rail, and where the first magnetic field value, the second magnetic field value, the third magnetic field value, and the fourth magnetic field value may be used to determine an amount of current associated with the current passing through the current rail.

According to some possible implementations, a method may comprise: sensing, by a first Hall cell included in a current sensor, a first magnetic field value associated with a magnetic field generated by a current passing through a current rail; sensing, by a second Hall cell included in the current sensor, a second magnetic field value associated with the magnetic field generated by the current passing through the current rail, where the second Hall cell may be located on an axis and at a first distance from the first Hall cell, where the axis may be substantially perpendicular to the current and substantially parallel to a face of the current rail; sensing, by a third Hall cell included in the current sensor, a third magnetic field value associated with the magnetic field generated by the current passing through the current rail, where the third Hall cell may be located on the axis and at a second distance from the first Hall cell, where the second distance may be less than the first distance such that the third Hall cell is located on the axis and between the first Hall cell and the second Hall cell; sensing, by a fourth Hall cell included in the current sensor, a fourth magnetic field value associated with the magnetic field generated by the current passing through the current rail, where the fourth Hall cell may be located adjacent to the first Hall cell in a direction substantially parallel to a direction of the current; sensing, by a fifth Hall cell included in the current sensor, a fifth magnetic field value associated with the magnetic field generated by the current passing through the current rail, where the fifth Hall cell may be located on the axis and at a third distance from the fourth Hall cell in a direction substantially perpendicular to the current passing through the current rail; deriving, by the current sensor, a differential Hall signal based on the first magnetic field value and the second magnetic field value; deriving, by the current sensor, a first auxiliary Hall signal based on the third magnetic field value; deriving, by the current sensor, a second auxiliary Hall signal based on the fourth magnetic field value and the fifth magnetic field value; determining, by the current sensor, a corrected differential Hall signal based on the differential Hall signal, the first auxiliary Hall signal, and the second auxiliary Hall signal; and determining, by the current sensor, an amount of current, associated with the current passing through the current rail, based on the corrected differential Hall signal.

DETAILED DESCRIPTION

Figure 1A:
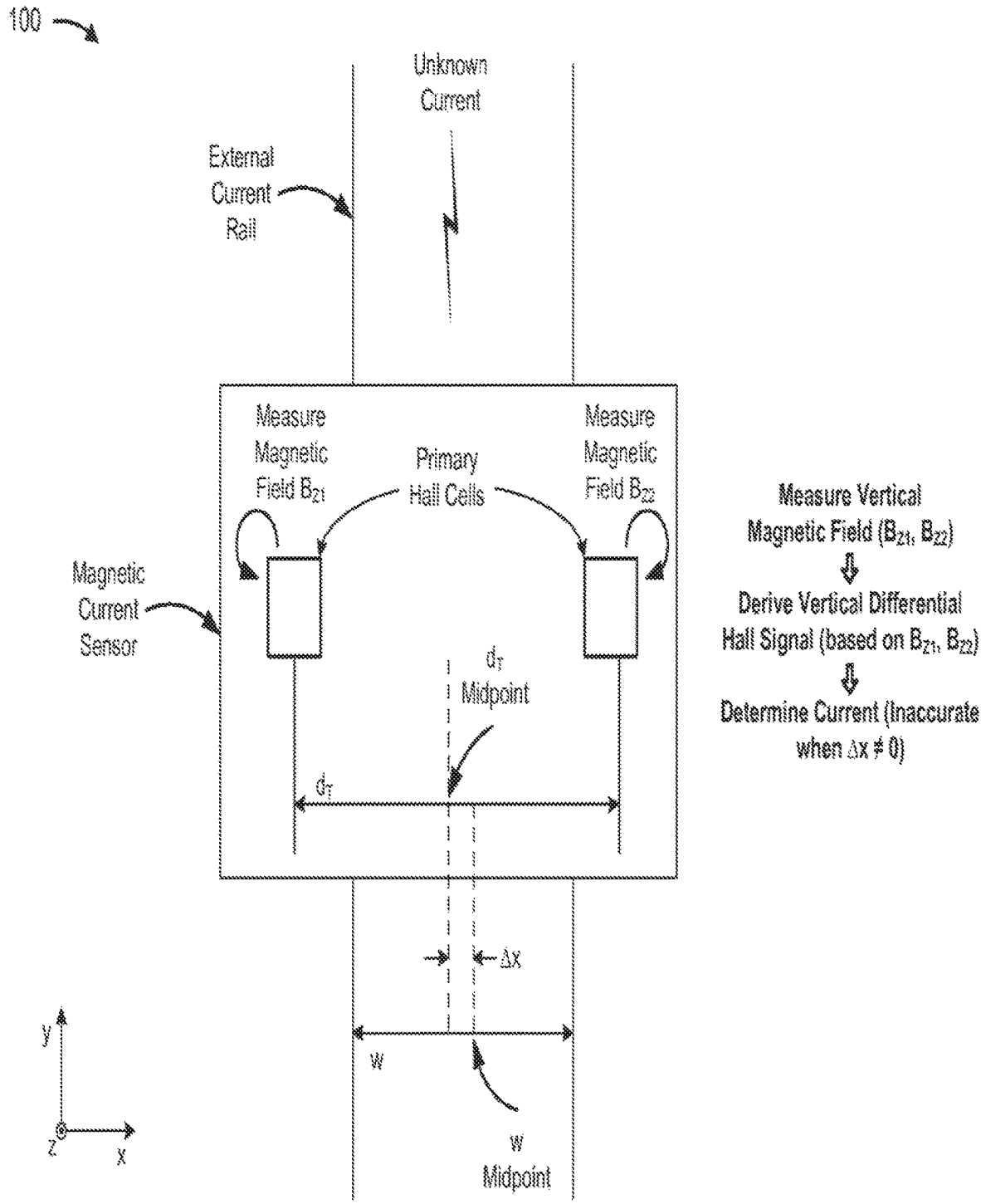
FIGS. 1A-1D are diagrams of an overview of an example implementation described herein.

The following detailed description of example implementations refers to the accompanying drawings. The same reference numbers in different drawings may identify the same or similar elements.

A differential-Hall based magnetic current sensor may make use of an external current rail (e.g., a trace on a printed circuit board (PCB) plate to which the magnetic current sensor is attached, positioned adjacent to, etc.) in order to determine an amount of current passing through the current rail. The magnetic current sensor may be positioned relative to and attached (e.g., soldered) to the current rail such that two primary Hall cells (e.g., lateral Hall cells included in the magnetic current sensor) are located relative to opposite sides of the current rail (e.g., opposite sides of the center of a symmetric current rail). The primary Hall cells may sense opposite vertical magnetic field values (e.g., associated with a magnetic field generated by the current as the current passes through the current rail) on the opposite sides of the current rail, and may determine the amount of current passing through the current rail based on a vertical differential Hall signal derived from the sensed vertical magnetic field values. However, the vertical differential Hall signal, derived from the vertical magnetic field values, may be sensitive to placement of the magnetic current sensor on the current rail.

For example, if the magnetic current sensor is positioned such that the primary Hall cells are not horizontally equidistant (e.g., in an x-direction on the face of the current rail and substantially perpendicular to the direction of the current) from the center of a symmetric current rail, then the derived vertical differential Hall signal may be affected such that the magnetic current sensor may inaccurately determine the amount of current passing through the current rail. Such a positioning error may be referred to as a horizontal positioning error. In some cases, an assembly process associated with attaching the magnetic current sensor in a position relative to the current rail may allow for a horizontal positioning tolerance (e.g., ±100 micrometers (μm), ±200 μm, etc.) in the x-direction.

As another example, if the magnetic current sensor is positioned such that the primary Hall cells are not vertically separated from the current rail by a known distance (e.g., in a z-direction away from the current rail and substantially perpendicular to the face of the current rail), then the derived vertical differential Hall signal may also be affected such that the magnetic current sensor may inaccurately determine the amount of current passing through the current rail. Such a positioning error may be referred to as a vertical positioning error. In some cases, an assembly process associated with attaching the magnetic current sensor in a position relative to the current rail may allow for a vertical positioning tolerance (e.g., ±65 μm, etc.) in the z-direction. Moreover, vertical positioning error may be introduced after the current sensor is attached to the current rail (e.g., due to swelling).

One technique that may be used to correct the vertical differential Hall signal is to implement End-of-Line (EOL) calibration after the magnetic current sensor is (fixedly) placed relative to the current rail. EOL calibration may include forcing a known current through the current rail in both directions (e.g., in order to cancel potential sensor-offset effects), and calculating a gain correction factor as a ratio of a target vertical differential Hall signal (e.g., known based on the known current) and an actual vertical differential Hall signal (e.g., derived by the magnetic current sensor). The gain correction factor may then be used to adjust a compensation constant (e.g., stored in an Electrically Erasable Programmable Read-Only Memory (EEPROM) in the magnetic current sensor, on a micro-controller configured to process the differential Hall signal, etc.), and the compensation constant may, during application, automatically and continuously be applied to the derived vertical differential Hall signal in order to cancel the differential Hall signal error (e.g., due to horizontal positioning error or due to vertical positioning error) that may otherwise arise. However, implementing such an EOL calibration process may increase a variety of costs associated with the magnetic current sensor (e.g., additional testing time, additional equipment costs, increased production complexity, etc.). Moreover. EOL calibration may be ineffective with respect to correcting vertical positioning error that is introduced at a later time (e.g., due to swelling after the current sensor is installed).

Implementations described herein may provide a magnetic current sensor that includes one or more auxiliary Hall cells (e.g., lateral Hall cells and/or vertical Hall cells), positioned with respect to two primary Hall cells, that may sense magnetic field values, associated with a magnetic field generated by a current passing through a current rail. Information associated with the magnetic field values sensed by the one or more auxiliary Hall cells may then be used to correct a differential Hall signal error that arises due to a horizontal positioning error and/or a vertical positioning error associated with attaching the magnetic current sensor in a position relative to the current rail.

FIGS. 1A-1D are diagrams of an overview of an example implementation 100 described herein. For the purposes of example implementation 100, assume that a magnetic current sensor is attached in a position relative to a symmetrical current rail (e.g., a current rail with a constant width in a direction perpendicular to the current) that is external to the magnetic current sensor and that has a width w. Further, assume that the magnetic current sensor includes a pair of primary Hall cells (e.g., lateral Hall cells) separated by a particular horizontal distance (e.g., $d_T$).

As shown in FIG. 1A, the magnetic current sensor may be positioned in a position relative to the current rail such that the midpoint of the current rail (e.g., w midpoint) is not aligned with the midpoint of the distance between the pair of primary Hall cells (e.g., $d_T$ midpoint), but within a horizontal positioning tolerance associated with attaching the magnetic current sensor in a position relative to the current rail. As shown, the magnetic current sensor may be positioned such that the w midpoint and $d_T$ midpoint are separated by a particular horizontal distance (e.g., $\Delta x$).

As further shown, during operation, the primary Hall cells may sense opposite vertical magnetic field values (e.g., magnetic field $B_{Z1}$ and magnetic field $B_{Z2}$) when an unknown current passes through the current rail. As further shown, the magnetic current sensor may derive a vertical differential Hall signal based on the magnetic field values sensed by the primary Hall cells, and may determine an amount of current based on the derived vertical differential Hall signal. However, since $d_T$ midpoint and w midpoint are separated by $\Delta x$, and since no correction was made to adjust the vertical differential Hall signal derived in order to compensate for $\Delta x$, the amount of current determined by the magnetic current sensor may be inaccurate. In order to solve this problem without implementing EOL calibration, an auxiliary lateral Hall cell (e.g., an additional Hall cell associated with measuring a vertical magnetic field) may be included in the magnetic current sensor.

Figure 1B:
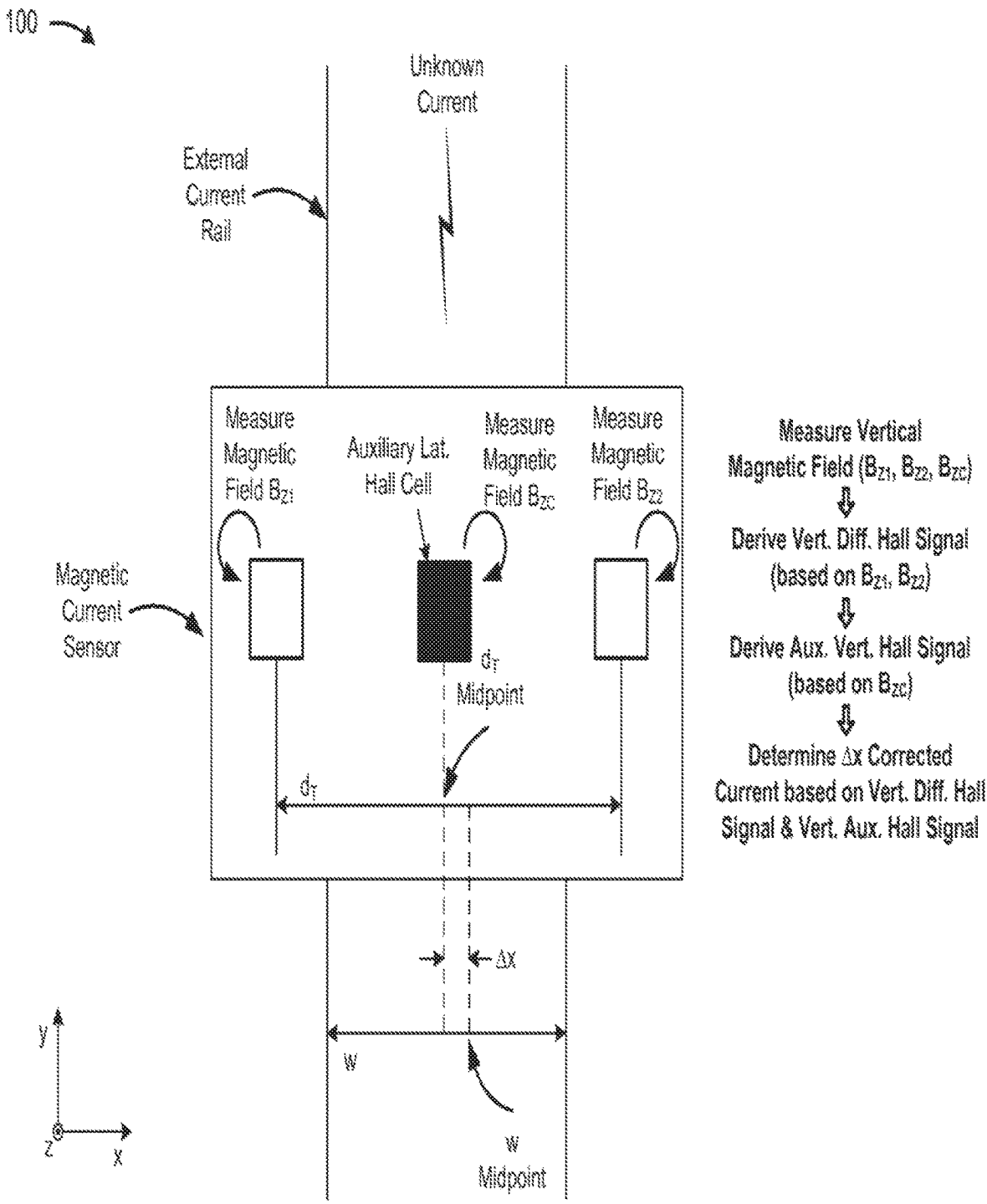

As shown in FIG. 1B, assume that, instead of including only two primary Hall cells separated by a particular distance $d_T$, the magnetic current sensor includes an auxiliary lateral Hall cell (e.g., an auxiliary Hall cell configured to sense a vertical magnetic field) positioned between the two primary Hall cells. As shown, the auxiliary lateral Hall cell may be positioned such that the auxiliary lateral Hall cell lies at $d_T$ midpoint (i.e., the auxiliary lateral Hall cell may lie halfway between the two primary Hall cells). In some implementations, the auxiliary lateral Hall cell may be positioned at another location between the two primary Hall cells (i.e., the auxiliary lateral Hall cell may be positioned at a location between the primary Hall cells other than at $d_T$ midpoint).

As further shown, during operation, the primary Hall cells may sense opposite vertical magnetic field values (e.g., magnetic field $B_{Z1}$ and magnetic field $B_{Z2}$) when an unknown current passes through the current rail, and the auxiliary lateral Hall cell may sense another vertical magnetic field value (e.g., magnetic field $B_{ZC}$) at $d_T$ midpoint. As further shown, the magnetic current sensor may derive a vertical differential Hall signal based on the vertical magnetic field values sensed by the primary Hall cells, and may derive an auxiliary vertical Hall signal based on the vertical magnetic field value sensed by the auxiliary lateral Hall cell. As further shown, the magnetic current sensor may then determine a corrected vertical differential Hall signal based on the vertical differential Hall signal and the auxiliary vertical Hall signal (e.g., without EOL calibration), and may determine the amount of current, accordingly.

In this way, a magnetic current sensor may include an auxiliary lateral Hall cell positioned between two primary Hall cells. The auxiliary lateral Hall cell may sense a vertical magnetic field value, associated with a magnetic field generated by a current passing through a current rail, at a position between the two primary Hall cells. The vertical magnetic field value, sensed by the auxiliary lateral Hall cell, may then be used to correct a vertical differential Hall signal error that arises due to a horizontal positioning error associated with attaching the magnetic current sensor in a position relative to the current rail.

For the purposes of FIG. 1C, once again assume that the magnetic current sensor is attached in a position relative to a symmetrical current rail that is external to the magnetic current sensor and that has a width w. Further, assume that the magnetic current sensor includes a pair of primary Hall cells separated from a face of the current rail by a particular vertical distance (e.g., $z_T$).

Figure 1C:
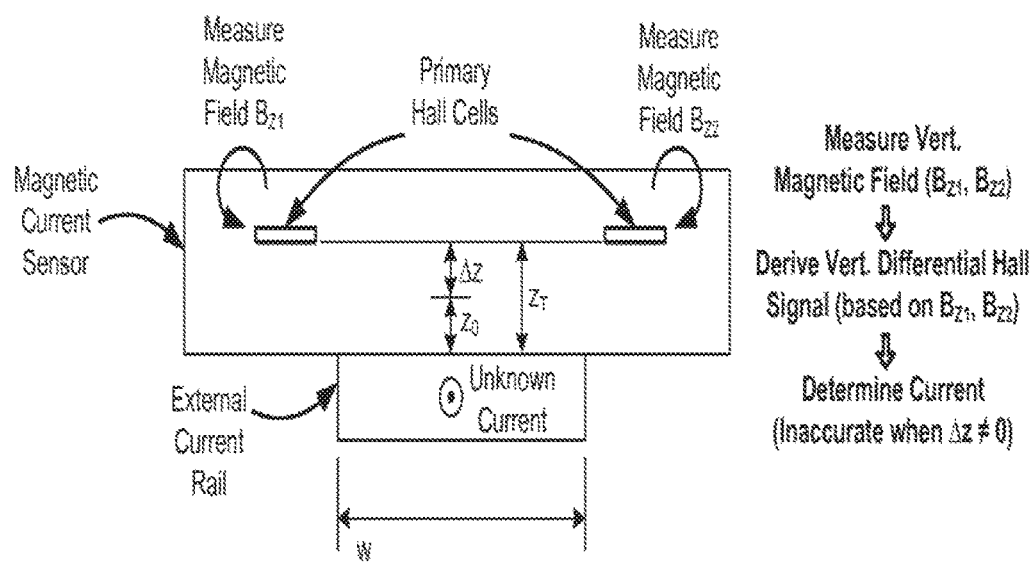

As shown in FIG. 1C, the magnetic current sensor may be vertically positioned in a position relative to the current rail such that the pair of primary Hall cells is separated from a face of the current rail by $z_T$. However, as shown, $z_T$ may comprise a known vertical distance associated with the geometry of the magnetic current sensor (e.g., $z_0$) and an unknown vertical distance associated with a vertical positioning error (e.g., $\Delta z$).

As further shown, during operation, the primary Hall cells may sense opposite vertical magnetic field values (e.g., magnetic field $B_{Z1}$ and magnetic field $B_{Z2}$) when an unknown current passes through the current rail. As further shown, the magnetic current sensor may derive a vertical differential Hall signal based on the magnetic field values sensed by the primary Hall cells, and may determine an amount of current based on the derived vertical differential Hall signal. However, since $z_T$ is not equal to $z_0$ (e.g., due to the $\Delta z$ vertical positioning error), and since no correction was made to adjust the vertical differential Hall signal derived in order to compensate for $\Delta z$, the amount of current determined by the magnetic current sensor may be inaccurate. In order to solve this problem without implementing EOL calibration, a set of auxiliary vertical Hall cells (e.g., a set of Hall cells associated with measuring a horizontal magnetic field) may be included in the magnetic current sensor.

Figure 1D:
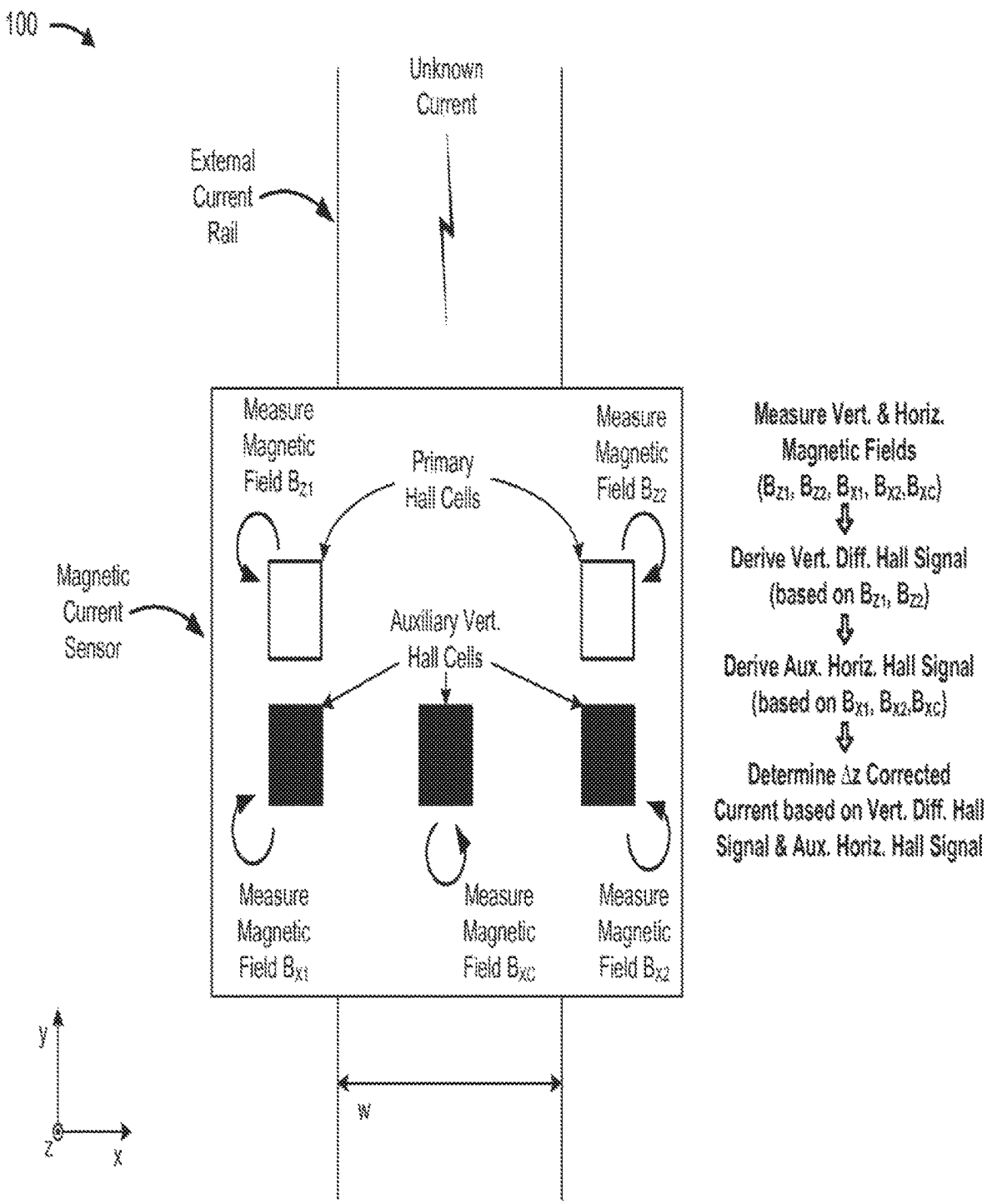

As shown in FIG. 1D, assume that, instead of including only two primary Hall cells, the magnetic current sensor includes a set of three auxiliary vertical Hall cells (e.g., a set of auxiliary vertical Hall cells configured to sense a horizontal magnetic field). As shown, the set of auxiliary vertical Hall cells may be positioned such that a first auxiliary vertical Hall cell and a second auxiliary vertical Hall cell are adjacent to the two primary Hall cells (e.g., in a y-direction along the current rail), and such that a third auxiliary vertical Hall cell is positioned between the first auxiliary vertical Hall cell and the second auxiliary vertical Hall cell (e.g., at $d_T$ midpoint). In some implementations, the auxiliary vertical Hall cells may be positioned in another manner (e.g., such that the third auxiliary vertical Hall cell does not lie at $d_T$ midpoint between the first auxiliary vertical Hall cell and the second auxiliary vertical Hall cell). In some implementations, the second auxiliary vertical Hall cell may be optional, as further described below.

As further shown, during operation, the primary Hall cells may sense opposite vertical magnetic field values (e.g., magnetic field $B_{Z1}$ and magnetic field $B_{Z2}$) when an unknown current passes through the current rail, and the first auxiliary vertical Hall cell, the second auxiliary vertical Hall cell, and the third auxiliary vertical Hall cell may sense a first horizontal magnetic field value (e.g., magnetic field $B_{X1}$), a second horizontal magnetic field value (e.g., magnetic field $B_{X2}$), and a third horizontal magnetic field value (e.g., magnetic field $B_{XC}$), respectively. As further shown, the magnetic current sensor may derive a vertical differential Hall signal based on the vertical magnetic field values sensed by the primary Hall cells, and may derive an auxiliary horizontal Hall signal based on the horizontal magnetic field values sensed by the set of auxiliary vertical Hall cells. As further shown, the magnetic current sensor may then determine a corrected vertical differential Hall signal based on the vertical differential Hall signal and the auxiliary horizontal Hall signal (e.g., without EOL calibration), and may determine the amount of current, accordingly.

In this way, a magnetic current sensor may include a set of auxiliary vertical Hall cells positioned with respect to two primary Hall cells. The set of auxiliary vertical Hall cells may sense a set of horizontal magnetic field values, associated with a magnetic field generated by a current passing through a current rail. The set of horizontal magnetic field values, sensed by the set of auxiliary vertical Hall cells, may then be used to correct a vertical differential Hall signal error that arises due to a vertical positioning error associated with attaching the magnetic current sensor in a position relative to the current rail.

In some implementations, the magnetic current sensor may include the auxiliary lateral Hall cell and the set of auxiliary vertical Hall cells, as described below. In this way, the magnetic current sensor may be capable of compensating for both a horizontal positioning error and a vertical positioning error associated with attaching the magnetic current sensor to the current rail.

Figure 2:
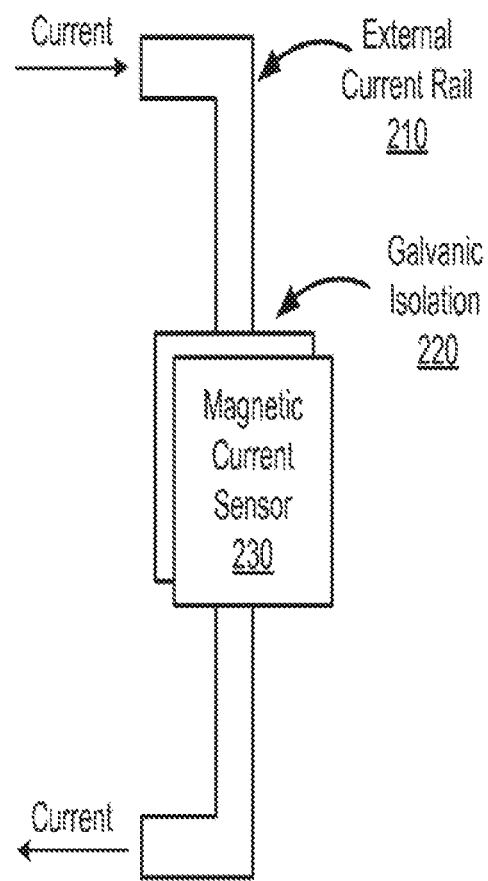
FIG. 2 is a diagram of an example environment in which apparatuses described herein may be implemented.

FIG. 2 is a diagram of an example environment 200 in which apparatuses described herein may be implemented. As shown in FIG. 2, environment 200 may include an external current rail 210, a galvanic isolation component 220, and a magnetic current sensor 230.

External current rail 210 may include an electrically conductive track between two or more electronic components. For example, external current rail 210 may include a trace on a PCB that connects two components of an electrical circuit. In some implementations, a current may pass through external current rail 210 (e.g., from one electrical component to another electrical component, from a current source to an electrical component, etc.).

Galvanic isolation component 220 may include a component that isolates magnetic current sensor 230 from external current rail 210 such that current, passing through external current rail 210, may not flow into magnetic current sensor 230. In some implementations, galvanic isolation 220 may be placed (e.g., between external current rail 210 and magnetic current sensor 230) such that magnetic current sensor 230 is capable of sensing a magnetic field generated by the current passing through external current rail 210.

Magnetic current sensor 230 may include a sensor designed to determine an amount of current passing through external current rail 210. For example, magnetic current sensor 230 may determine the amount of current passing through external current rail 210 based on sensing a magnetic field generated by the current. In some implementations, magnetic current sensor 230 may be positioned such that magnetic current sensor 230 is separated from external current rail 210 by galvanic isolation component 220. In some implementations, magnetic current sensor 230 may include a differential Hall component (e.g., including a pair of primary Hall cells, an auxiliary lateral Hall cell, and/or a set of auxiliary vertical Hall cells) associated with sensing the magnetic field generated by the current, and one or more other components. Additional details regarding magnetic current sensor 230 are described below with regard to FIG. 3. In some implementations, magnetic current sensor 230 may be housed in package comprising a semiconductor chip.

The number and arrangement of apparatuses shown in FIG. 2 are provided as an example. In practice, there may be additional apparatuses, fewer apparatuses, different apparatuses, or differently arranged apparatuses than those shown in FIG. 2. Furthermore, two or more apparatuses shown in FIG. 2 may be implemented within a single apparatus, or a single apparatus shown in FIG. 2 may be implemented as multiple, distributed apparatuses. Additionally, or alternatively, a set of apparatuses (e.g., one or more apparatuses) of environment 200 may perform one or more functions described as being performed by another set of apparatuses of environment 200.

Figure 3:
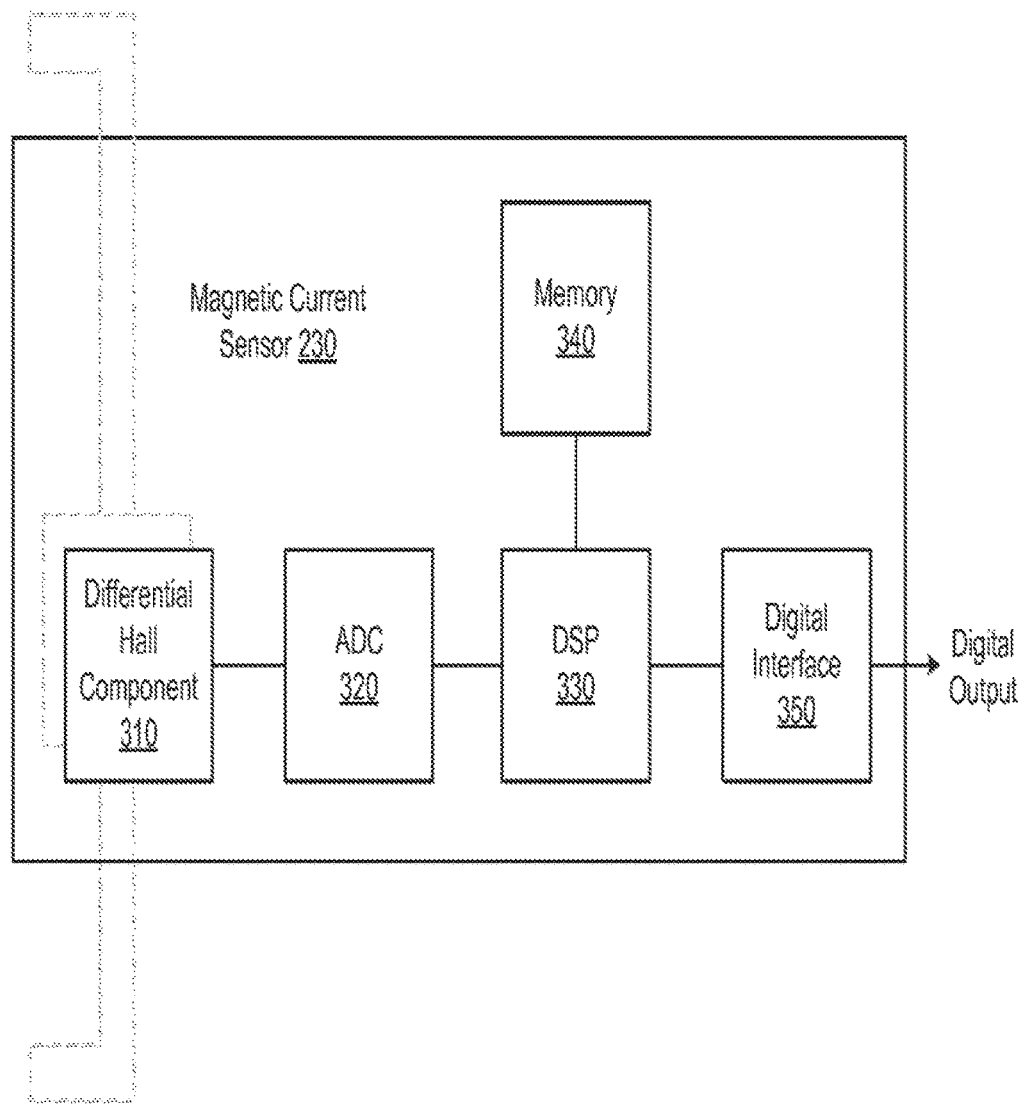
FIG. 3 is a diagram of example components of a magnetic current sensor included in the example environment of FIG. 2.

FIG. 3 is a diagram of example components of a magnetic current sensor 230 included in the example environment 200 of FIG. 2. As shown, magnetic current sensor 230 may include a differential Hall component 310, an analog-to-digital convertor (ADC) 320, a digital signal processor (DSP) 330, a memory component 340, and a digital interface 350.

Differential Hall component 310 may include a component designed to sense a magnetic field generated by a current passing through external current rail 210. In some implementations, differential Hall component may include a pair of primary Hall cells, an auxiliary lateral Hall cell, and a set of auxiliary vertical Hall cells. Each Hall cell may be capable of sensing a magnetic field value (e.g., a vertical magnetic field value or a horizontal magnetic field value). In some implementations, each Hall cell may provide information associated with the sensed magnetic field values to ADC 320. Alternatively, differential Hall cell component 310 may process analog signals, associated with the sensed magnetic fields (e.g., without analog-to-digital conversion by ADC 320) in order to determine a corrected differential Hall signal. Additional details regarding differential Hall component 310 are described below with regard to FIG. 4.

ADC 320 may include an analog-to-digital converter that converts an analog signal (e.g., a voltage signal) from differential Hall component 310 to a digital signal. For example, ADC 320 may convert analog signals, received from differential Hall component 310, into digital signals to be processed by DSP 330. ADC 320 may provide the digital signals to DSP 330. In some implementations, magnetic current sensor 230 may include one or more ADCs 320.

DSP 330 may include a digital signal processing device or a collection of digital signal processing devices. In some implementations, DSP 330 may receive a digital signal from ADC 320 and may process the digital signal to form an output (e.g., information that identifies the amount of current passing through external current rail 210, information associated with the differential Hall signal, information associated with the auxiliary Hall signal, etc.). For example, DSP 330 may derive and/or receive a digital signal corresponding to a vertical magnetic field value sensed by primary Hall cell(s), the auxiliary lateral Hall cell, and/or the set of auxiliary vertical Hall cells. DSP 330 may determine a corrected differential Hall signal based on the derived and/or received digital signal(s), and may provide information associated with the corrected differential Hall signal. While implementations described herein are described in the context of DSP 330 performing processing on digital signals corresponding to sensed magnetic field values, in some implementations, another component of magnetic sensor may perform a similar type of processing. For example, differential Hall component 310 may perform processing on analog signals corresponding to sensed magnetic field values (e.g., before analog-to-digital conversion is performed).

Memory 340 may include a read only memory (ROM) (e.g., an EEPROM), a random access memory (RAM), and/or another type of dynamic or static storage device (e.g., a flash memory, a magnetic memory, an optical memory, etc.) that stores information and/or instructions for use by magnetic current sensor 230. In some implementations, memory component 340 may store a compensation constant that is to be applied during processing performed by DSP 330.

Digital interface 350 may include an interface via which magnetic current sensor 230 may receive and/or provide information from and/or to another device, such as information associated with an amount of current determined by magnetic current sensor 230. For example, digital interface may provide the output determined by DSP 330, that identifies the amount of current passing through external current rail 210.

The number and arrangement of components shown in FIG. 3 are provided as an example. In practice, magnetic current sensor 230 may include additional components, fewer components, different components, or differently arranged components than those shown in FIG. 3. Additionally, or alternatively, a set of components (e.g., one or more components) of magnetic current sensor 230 may perform one or more functions described as being performed by another set of components of magnetic current sensor 230.

Figure 4A:
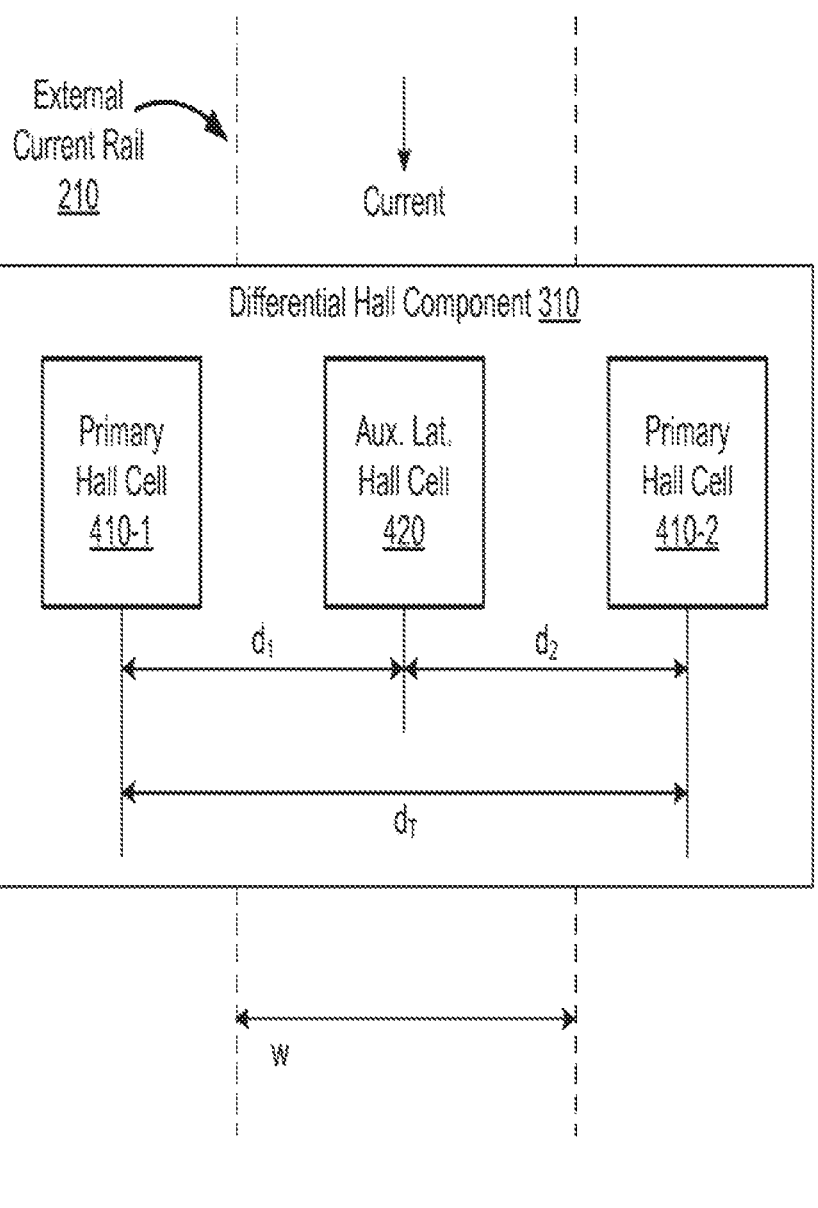
FIGS. 4A-4C are diagrams of example components of a Hall differential component included in the example magnetic current sensor of FIG. 3.
Figure 4B:
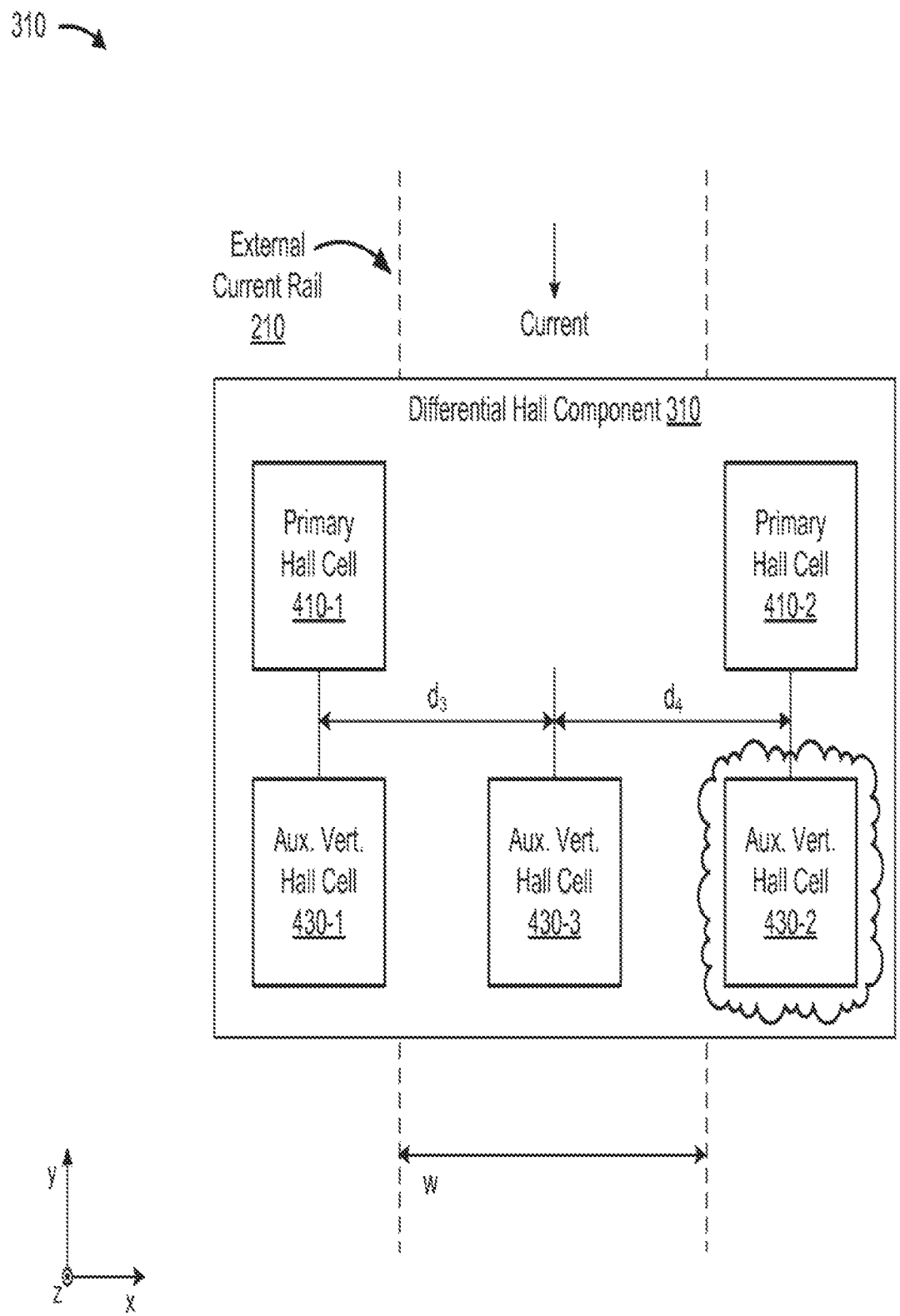
Figure 4C:
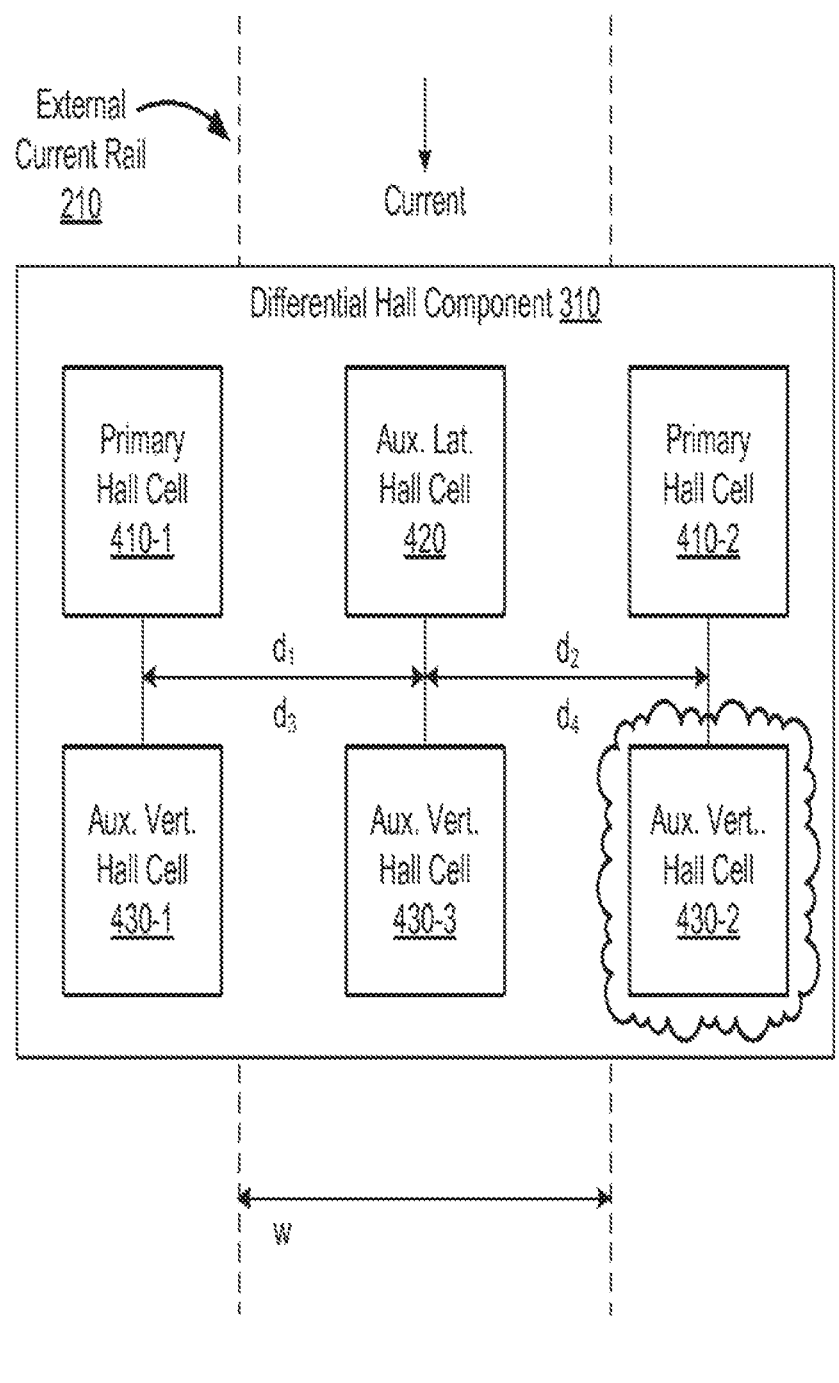

FIGS. 4A-4C are diagrams of example components of a differential Hall component 310 included in the example magnetic current sensor 230 of FIG. 3. As shown in FIG. 4A, one example differential Hall component 310 may include a set of two primary Hall cells 410 (e.g., primary Hall cell 410-1 and primary Hall cell 410-2), and an auxiliary lateral Hall cell 420.

Primary Hall cell 410 may include a transducer designed to provide an output in response to sensing a vertical magnetic field value corresponding to a current travelling through external current rail 210. For example, primary Hall cell 410 may provide a vertical magnetic field value that allows magnetic current sensor 230 (e.g., DSP 330, differential Hall component 310) to derive (e.g., based on vertical magnetic field values provided by two primary Hall cells 410) a vertical differential Hall signal that corresponds to the current passing through external current rail 210.

Auxiliary lateral Hall cell 420 may include a transducer designed to provide an output in response to sensing a vertical magnetic field value associated with correcting a vertical differential Hall signal in order to compensate for a horizontal positioning error associated with attaching magnetic current sensor 230 to external current rail 210. For example, auxiliary lateral Hall cell 420 may provide an output that allows magnetic current sensor 230 (e.g., DSP 330, differential Hall component 310) to derive an auxiliary vertical Hall signal and/or correct the vertical differential Hall signal based on the derived auxiliary vertical Hall signal.

In some implementations, auxiliary lateral Hall cell 420 may be positioned between primary Hall cell 410-1 and primary Hall cell 410-2. For example, as shown in FIG. 4A, auxiliary lateral Hall cell 420 may be positioned such that auxiliary lateral Hall cell 420 lies at a first distance (e.g., $d_1$) from primary Hall cell 410-1 and a second distance (e.g., $d_2$) from primary Hall cell 410-2 (e.g., where $d_1+d_2=d_T$). In some implementations, $d_1$ may equal to $d_2$ (i.e., auxiliary lateral Hall cell 420 may be positioned halfway between primary Hall cell 410-1 and primary Hall cell 410-2). Alternatively, $d_1$ may not be equal to $d_2$ (i.e., auxiliary lateral Hall cell 420 may not be positioned halfway between primary Hall cell 410-1 and primary Hall cell 410-2). Additionally, while FIG. 4A shows distance $d_T$ as a distance that is greater than the width of external current rail 210 (e.g., w), in some implementations, $d_T$ may be less than or equal to w. Additionally, while FIG. 4A shows primary Hall cell 410-1, primary Hall cell 410-2, and auxiliary lateral Hall cell 420 as being centered with respect to a y-axis, in some implementations, Hall cell 410-1, primary Hall cell 410-2, or auxiliary lateral Hall cell 420 may not be centered with respect to the y-axis.

In some implementations, as described below, primary Hall cell 410-1, primary Hall cell 410-2, and auxiliary lateral Hall cell 420 may allow magnetic current sensor 230 (e.g., DSP 330, differential Hall component 310) to determine an amount of current, passing through external current rail 210, based on a corrected vertical differential Hall signal that has been corrected to compensate for a horizontal positioning error associated with attaching magnetic current sensor 230 in a position relative to external current rail 210.

As shown in FIG. 4B, another example differential Hall component 310 may include two primary Hall cells 410, and a set of auxiliary vertical Hall cells 430 (e.g., auxiliary vertical Hall cell 430-1, auxiliary vertical Hall cell 430-2, and auxiliary vertical Hall cell 430-3).

Auxiliary vertical Hall cells 430 may include a transducer designed to provide an output in response to sensing a horizontal magnetic field value associated with correcting a vertical differential Hall signal in order to compensate for a vertical positioning error associated with attaching magnetic current sensor 230 to external current rail 210. For example, auxiliary vertical Hall cells 430 may provide outputs that allow magnetic current sensor 230 (e.g., DSP 330, differential Hall component 310) to derive an auxiliary horizontal Hall signal and/or correct the vertical differential Hall signal based on the derived auxiliary horizontal Hall signal.

In some implementations, auxiliary vertical Hall cell 430-1 and 430-2 may be positioned adjacent to primary Hall cell 410-1 and primary Hall cell 410-2, respectively. For example, as shown in FIG. 4B, auxiliary vertical Hall cell 430-1 may be positioned adjacent to primary Hall cell 410-1 along a y-axis (e.g., an axis that runs parallel to the current along aface of external current rail). Similarly, as shown, auxiliary vertical Hall cell 430-2 may be positioned adjacent to primary Hall cell 410-2 along the y-axis. As further shown, auxiliary vertical Hall cell 430-3 may be positioned between auxiliary vertical Hall cell 430-1 and auxiliary vertical Hall cell 430-2 (e.g., along the x-axis) such that auxiliary vertical Hall cell 430-3 lies at a third distance (e.g., $d_3$) from auxiliary vertical Hall cell 430-1 and a fourth distance (e.g., $d_4$) from auxiliary vertical Hall cell 430-2 (e.g., where $d_3+d_4=d_7$). In some implementations, $d_3$ may equal to $d_4$ (i.e., auxiliary vertical Hall cell 430-3 may be positioned halfway between auxiliary vertical Hall cell 430-1 and auxiliary vertical Hall cell 430-2). Alternatively, $d_3$ may not be equal to $d_4$ (i.e., auxiliary vertical Hall cell 430-3 may not be positioned halfway between auxiliary vertical Hall cell 430-1 and auxiliary vertical Hall cell 430-2). In some implementations, differential Hall component 310 may not include auxiliary vertical Hall cell 430-2 (e.g., auxiliary vertical Hall cell 430-2 may be optionally included in differential Hall component 310). Alternatively, differential Hall component 310 may not include auxiliary vertical Hall cell 430-1 (e.g., auxiliary vertical Hall cell 430-1 may be optionally when differential Hall component 310 includes auxiliary vertical Hall cell 430-2). Additionally, while FIG. 4B shows auxiliary vertical Hall cell 430-1, auxiliary vertical Hall cell 430-2, and auxiliary vertical Hall cell 430-3 as being centered with respect to the y-axis, in some implementations, auxiliary vertical Hall cell 430-1, auxiliary vertical Hall cell 430-2, and auxiliary vertical Hall cell 430-3 may not be being centered with respect to the y-axis.

In some implementations, as described below, primary Hall cell 410-1, primary Hall cell 410-2, auxiliary vertical Hall cell 430-1, auxiliary vertical Hall cell 430-2, and auxiliary vertical Hall cell 430-3 may allow magnetic current sensor 230 (e.g., DSP 330, differential Hall component 310) to determine an amount of current, passing through external current rail 210, based on a corrected vertical differential Hall signal that has been corrected to compensate for a vertical positioning error associated with attaching magnetic current sensor 230 to the in a position relative to external current rail 210.

As shown in FIG. 4C, in some implementations, differential Hall component 310 may include primary Hall cell 410-1, primary Hall cell 410-2, auxiliary lateral Hall cell 420, auxiliary vertical Hall cell 430-1, auxiliary vertical Hall cell 430-2, and auxiliary vertical Hall cell 430-3. Such an implementation may allow magnetic current sensor 230 (e.g., DSP 330, differential Hall component 310) to determine an amount of current, passing through external current rail 210, based on a corrected vertical differential Hall signal that has been corrected to compensate for both a horizontal positioning error and a vertical positioning error associated with attaching magnetic current sensor 230 in a position relative to external current rail 210.

The number and arrangement of components shown in FIGS. 4A-4C are provided as an example. In practice, differential Hall component 310 may include additional components, different components, or differently arranged components than those shown in FIGS. 4A-4C.

By positioning a pair of primary Hall cells 410 in positions relative to opposite sides of external current rail 210 (e.g., with respect to a center of a symmetric current rail), and due to the differential Hall principle, vertical magnetic field values on opposite sides of a center of external current rail 210 may be differentiated from an external homogeneous magnetic field (e.g., Earth's magnetic field). For example, consider external current rail 210 (e.g., a PCB trace) of width w, and a magnetic current sensor 230 positioned in a position relative to external current rail 210 such that the vertical distance between each of the pair of primary Hall cells 410 and external current rail 210 is z.

Figure 5:
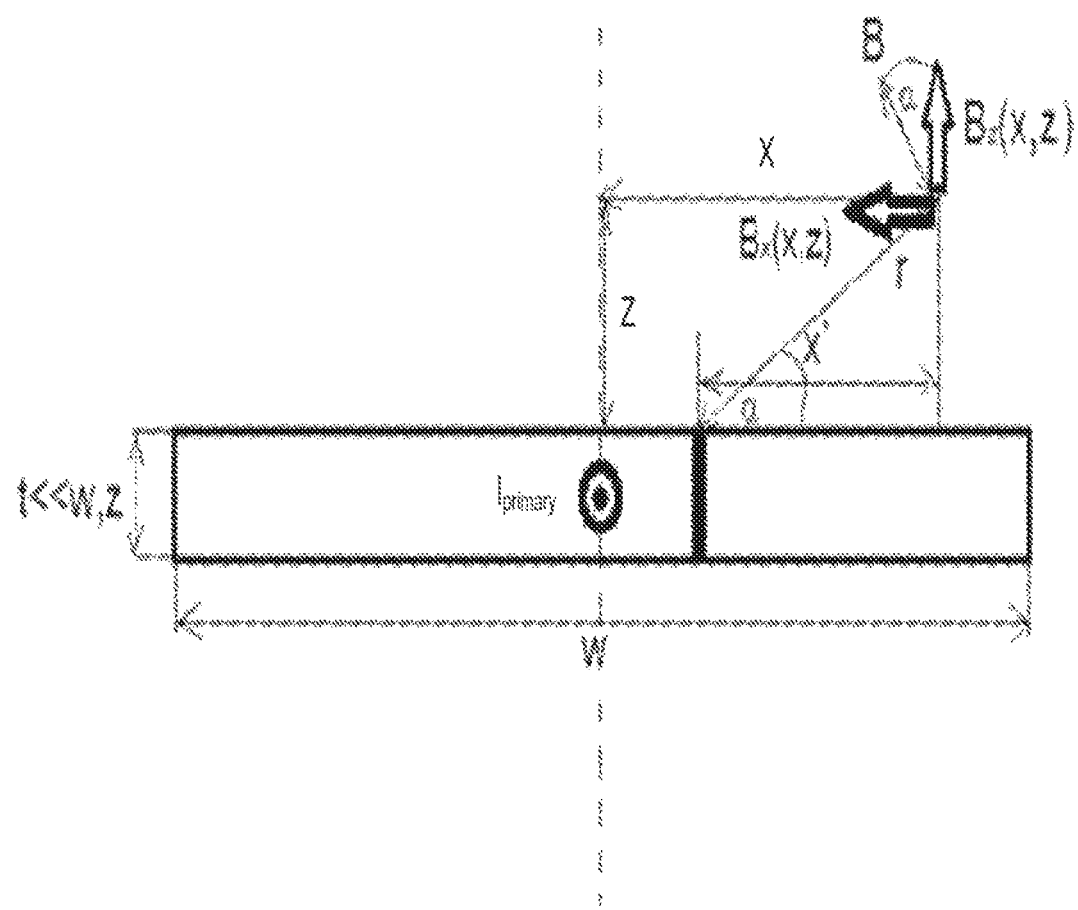
FIG. 5 is a diagram that shows an example cross section of an external current rail with respect to a vertical magnetic field and a horizontal magnetic field.

An example cross section showing geometry of external current rail 210 with respect to a vertical magnetic field and a horizontal magnetic field is shown in FIG. 5. Based on the geometry shown in FIG. 5, a vertical magnetic field (e.g., $B_Z(x,z)$) at an x-coordinate and a z-coordinate, with respect to external current rail 210, may be derived based on Maxwell's 4th Law:

$$dB_z(x', z) = \frac{\mu_0 dI}{2\pi r} \cdot \cos\alpha = \frac{\mu_0 I}{2\pi w} \cdot \frac{x'}{r^2} \cdot dx';$$

$$B_z(x, z) = \int dB_z(x', z) = \frac{\mu_0 I}{2\pi w} \cdot \int_{x-\frac{w}{2}}^{x+\frac{w}{2}} \frac{x'}{x'^2 + z^2} dx' = \frac{\mu_0 I}{4\pi w} \cdot \ln\left(\frac{\left(x+\frac{w}{2}\right)^2 + z^2}{\left(x-\frac{w}{2}\right)^2 + z^2}\right).$$

where $B_Z(x,z)$ represents a vertical magnetic field value, z represents a distance relative to external rail 210, x represents a position along external current rail 210 of width w, $\mu_0$ represents a permeability constant, and I represents a current.

A horizontal magnetic field (e.g., $Bx(x,z)$) at the x-coordinate and the z-coordinate may be similarly derived:

$$dB_x(x', z) = \frac{\mu_0 dI}{2\pi r} \cdot \sin\alpha = \frac{\mu_0 I}{2\pi w} \cdot \frac{z}{r^2} \cdot dx';$$

$$B_x(x, z) = \int dB_z(x', z) = \frac{\mu_0 I}{2\pi w} \cdot \int_{x-\frac{w}{2}}^{x+\frac{w}{2}} \frac{z}{x'^2 + z^2} dx' = \frac{\mu_0 I}{2\pi w} \cdot \left(arctg\left(\frac{x+\frac{w}{2}}{z}\right) - arctg\left(\frac{x-\frac{w}{2}}{z}\right)\right).$$

Figure 6:
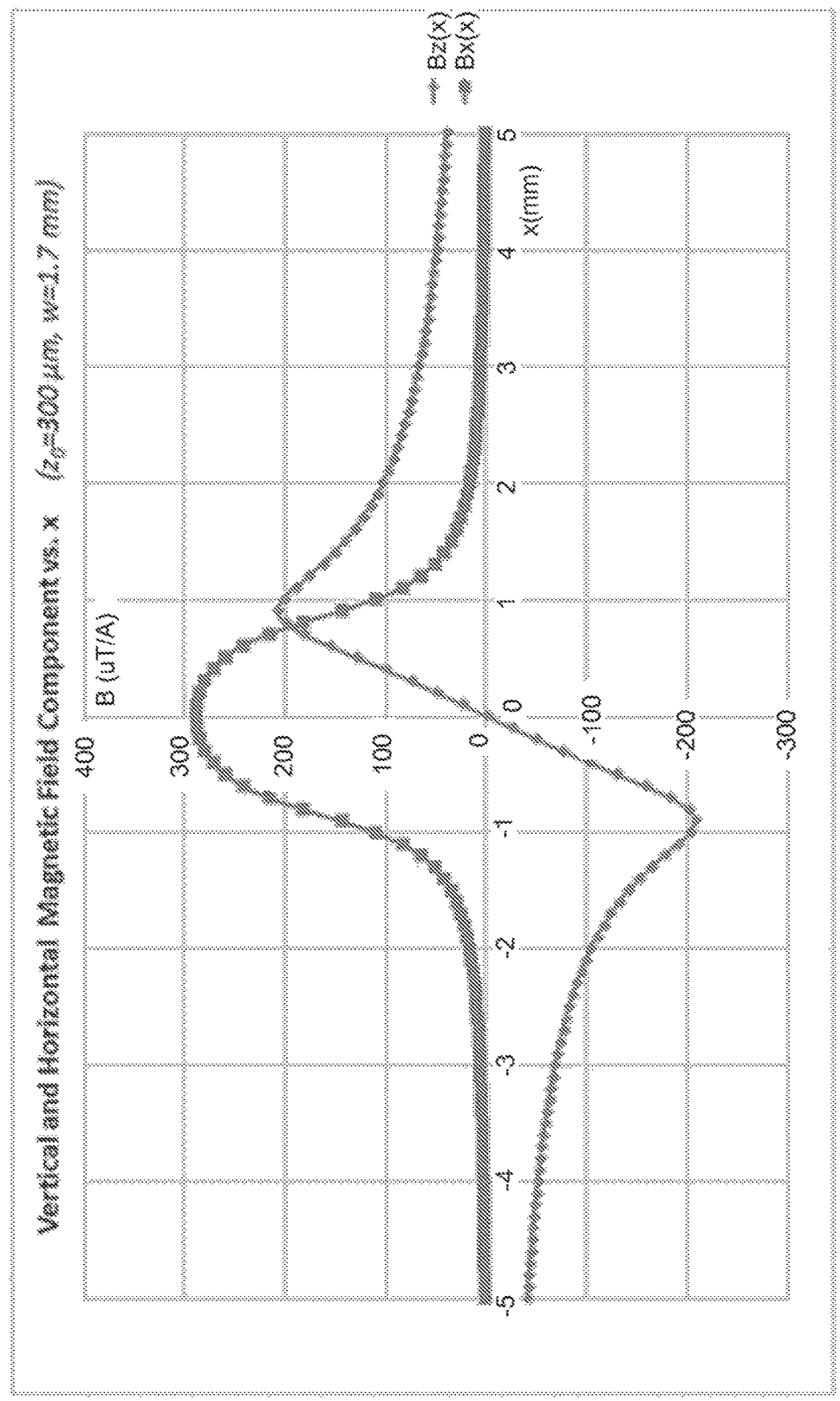
FIG. 6 is a graphical representation showing an example of how a vertical magnetic field and a horizontal magnetic field vary with respect to an x-coordinate perpendicular to current passing through an external current rail.

A graph illustrating an example of how the vertical magnetic field and the horizontal magnetic field vary with respect to x (e.g., for w=1.7 millimeters (mm) and $z_0$=300 μm) is shown in FIG. 6. In some implementations, it is desirable to attach magnetic current sensor 230 such that primary Hall cells 410 are positioned such that primary Hall cells 410 may derive a maximum differential Hall signal (e.g., in order to accurately determine the amount of current). For example, as shown in FIG. 6, it is desirable to position primary Hall cells 410 (e.g., included in magnetic current sensor 230) at approximately x=−1.0 mm and x=1.0 mm (e.g., a distance between primary Hall cell 410-1 and primary Hall cell 410-2 equal to 2.0 mm). With such a placement, primary Hall cells 410 may accurately sense the vertical magnetic field values such that magnetic current sensor 230 may derive a corresponding vertical differential Hall signal.

In some implementations, magnetic current sensor 230 (e.g., DSP 330, differential Hall component 310) may derive the vertical differential Hall signal based on the magnetic field values sensed by primary Hall cell 410-1 and primary Hall cell 410-2. In a case where magnetic current sensor 230 is positioned such that there is no horizontal positioning error (e.g., when magnetic current sensor 230 is centered substantially relative or with respect to a center of external current rail 210) and where there is no vertical positioning error (e.g., such that z is a known distance equal to $z_0$), the following differential Hall signal may be derived (e.g., where $d_T$ is the distance between primary Hall cell 410-1 and primary Hall cell 410-2):

$$U_{\textit{differential-Hall}}(0, z_0) = \frac{S_{Hall} \cdot \left(B_z\left(\frac{dT}{2}, z_0\right) - B_z\left(-\frac{dT}{2}, z_0\right)\right)}{2} = S_{Hall} \cdot B_{z,\textit{diff}}(0, z_0);$$

where $U_{\textit{differential-Hall}}(0,z_0)$ represents a vertical differential Hall signal (e.g., in milliVolts (mV)) at the symmetrical center of external current rail 210. $S_{Hall}$ represents a signal conversion factor (e.g., in mV/microTesla (μT)), and $B_{z,\textit{diff}}$ $(0,z_0)$ represents a vertical magnetic field (e.g., in μT) at the symmetrical center of external current rail 210. However, as described above, a horizontal positioning error and/or a vertical positioning error, associated with attaching magnetic current sensor 230 in a position relative to external current rail 210, may arise. Systems and/or methods that may allow magnetic current sensor 230 to correct a vertical differential Hall signal in order to compensate for a horizontal positioning error are first described below, followed by systems and/or methods that may allow magnetic current sensor 230 to correct a vertical differential Hall signal in order to compensate for a vertical positioning.

As described above, in some implementations, a horizontal positioning error may occur when attaching magnetic current sensor 230 in a position relative to external current rail 210. For example, a horizontal positioning error may occur when magnetic current sensor 230 is attached such that magnetic current sensor 230 is not centered directly relative to a center of external current rail 210 (e.g., in an x-direction perpendicular to the current and along the face of external current rail 210). For example, a horizontal positioning tolerance may allow magnetic current sensor 230 to be placed 100 μm off center of external current rail 210 (e.g., $\Delta x$=100 μm), placed 200 μm off center of external current rail 210 (e.g., $\Delta x$=200 μm), or the like, thus introducing a horizontal positioning error. In some cases, the vertical differential Hall signal derived from the vertical magnetic field values may be influenced by the horizontal positioning error associated with the placement of magnetic current sensor 230 as follows:

$$U_{\textit{differential-Hall}}(\Delta x, z_0) = \frac{S_{Hall} \cdot \left(B_z\left(\frac{d}{2}+\Delta x\right) - B_z\left(-\frac{d}{2}+\Delta x\right)\right)}{2} = S_{Hall} \cdot B_{z,\textit{diff}}(\Delta x, z_0);$$

where $U_{\textit{differential-Hall}}(\Delta x,z_0)$ represents a differential Hall signal (e.g., in mV) at horizontal distance $\Delta x$, from the symmetrical center of external current rail 210 and known vertical distance $z_0$, $S_{Hall}$ represents a signal conversion factor (e.g., in mV/μT), and $B_{z,\textit{diff}}(\Delta x,z_0)$ represents a magnetic field at horizontal distance $\Delta x$ from the symmetrical center of external current rail 210 and known vertical distance $z_0$ from external current rail 210 (e.g., in μT).

Figure 7:
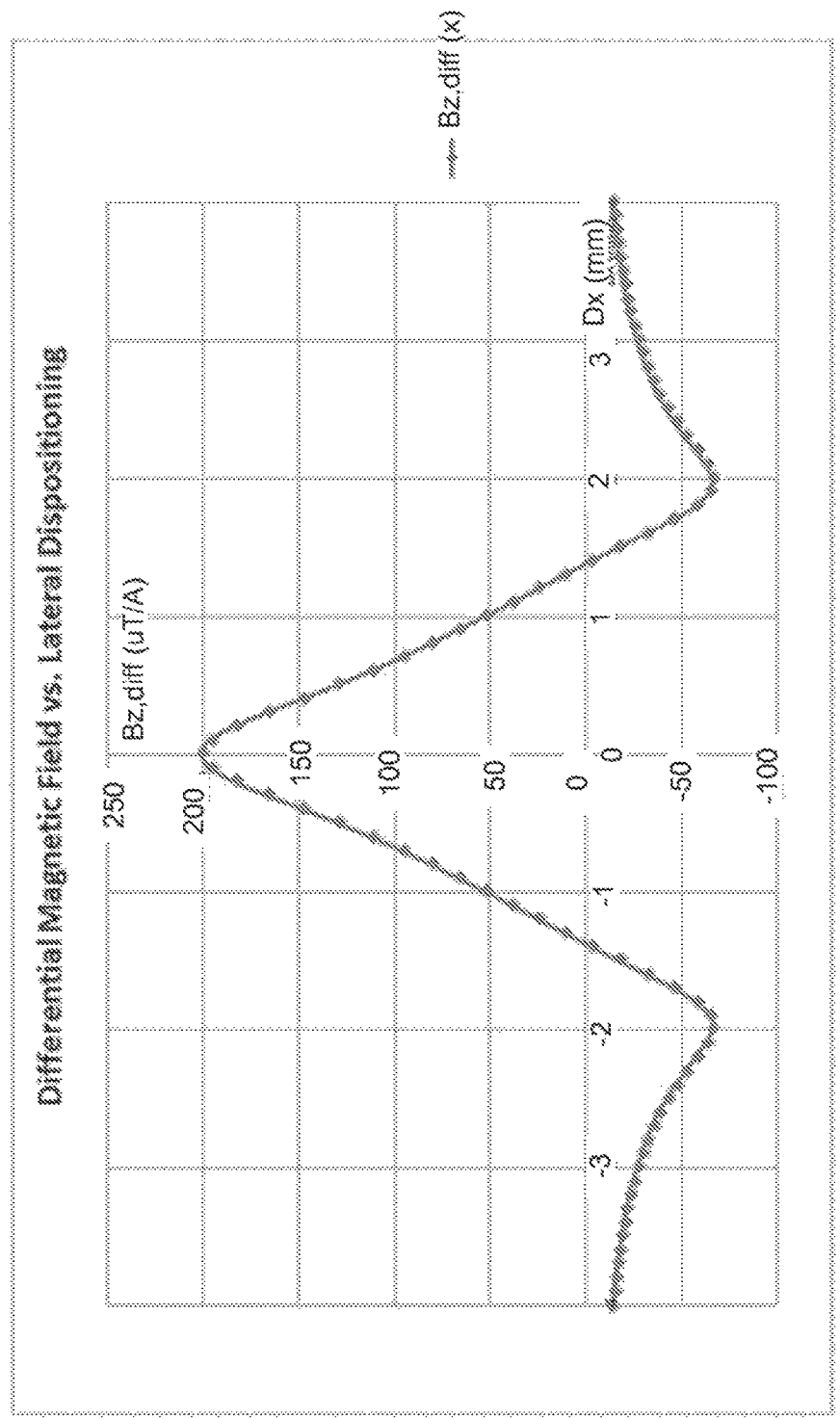
FIGS. 7 and 8 are diagrams that show an example of dependency of a differential magnetic field, sensed by a set of primary Hall cells, with respect to a horizontal positioning error.
Figure 8:
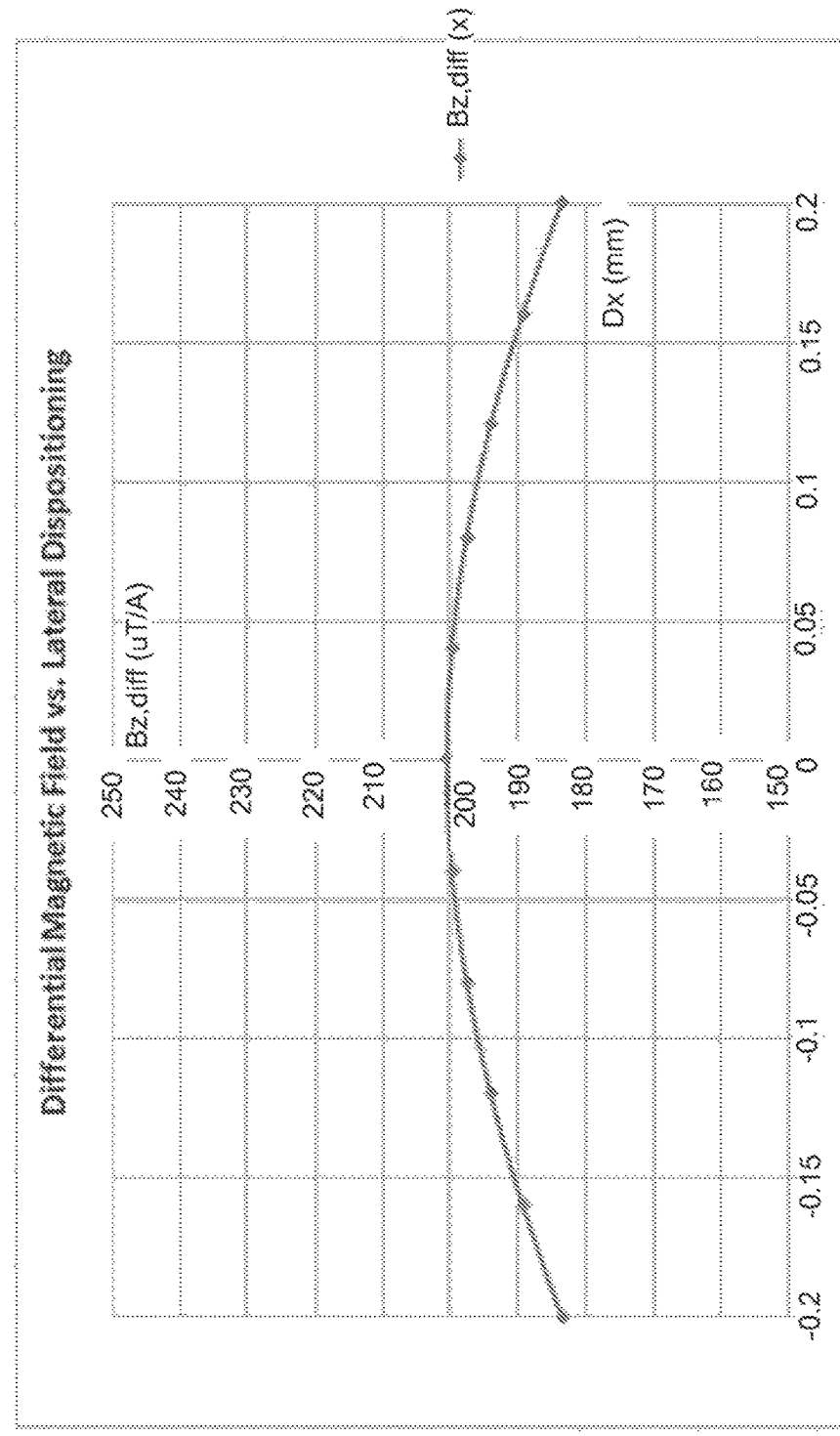

As such, the horizontal positioning error may affect (e.g., weaken) the vertical differential Hall signal derived by magnetic current sensor 230. FIG. 7 shows an example of a dependency of the vertical differential magnetic field, sensed by primary Hall cells 410 with respect to the horizontal positioning error, from $\Delta x$=−4.0 mm to $\Delta x$=4.0 mm. As shown, as the positioning error (e.g., $\Delta x$) moves further from zero, the vertical differential magnetic field (e.g., used to derive the differential Hall signal) may decrease. FIG. 8 an example of a dependency of the vertical differential magnetic field, sensed by primary Hall cells 410, with respect to the horizontal positioning error from $\Delta x$=−200 μm to $\Delta x$=200 μm. As shown, if the horizontal positioning error is equal to ±100 μm, then the vertical differential magnetic field may decrease by approximately −2.2% (e.g., from 200 microTeslas/Amp (μT/A) to approximately 196 μT/A). Similarly, if the horizontal positioning error is equal to ±200 μm, then the vertical differential magnetic field may decrease by approximately −8.4% (e.g., from 200 μT/A to approximately 183 μT/A). Unless a correction is applied in order to compensate for the horizontal positioning error, the horizontal positioning error will result in a similar decrease in the vertical differential Hall signal derived based on the sensed vertical magnetic field values associated with the vertical differential magnetic field. The signal sensitivity decrease resulting from the horizontal positioning error may be compensated for with the inclusion of auxiliary lateral Hall cell 420 between primary Hall cells 410. In some implementations, auxiliary lateral Hall cell 420 may sense a vertical magnetic field value at a location between primary Hall cells 410, and the vertical magnetic field value may be used to compensate for the horizontal positioning error.

Figure 9:
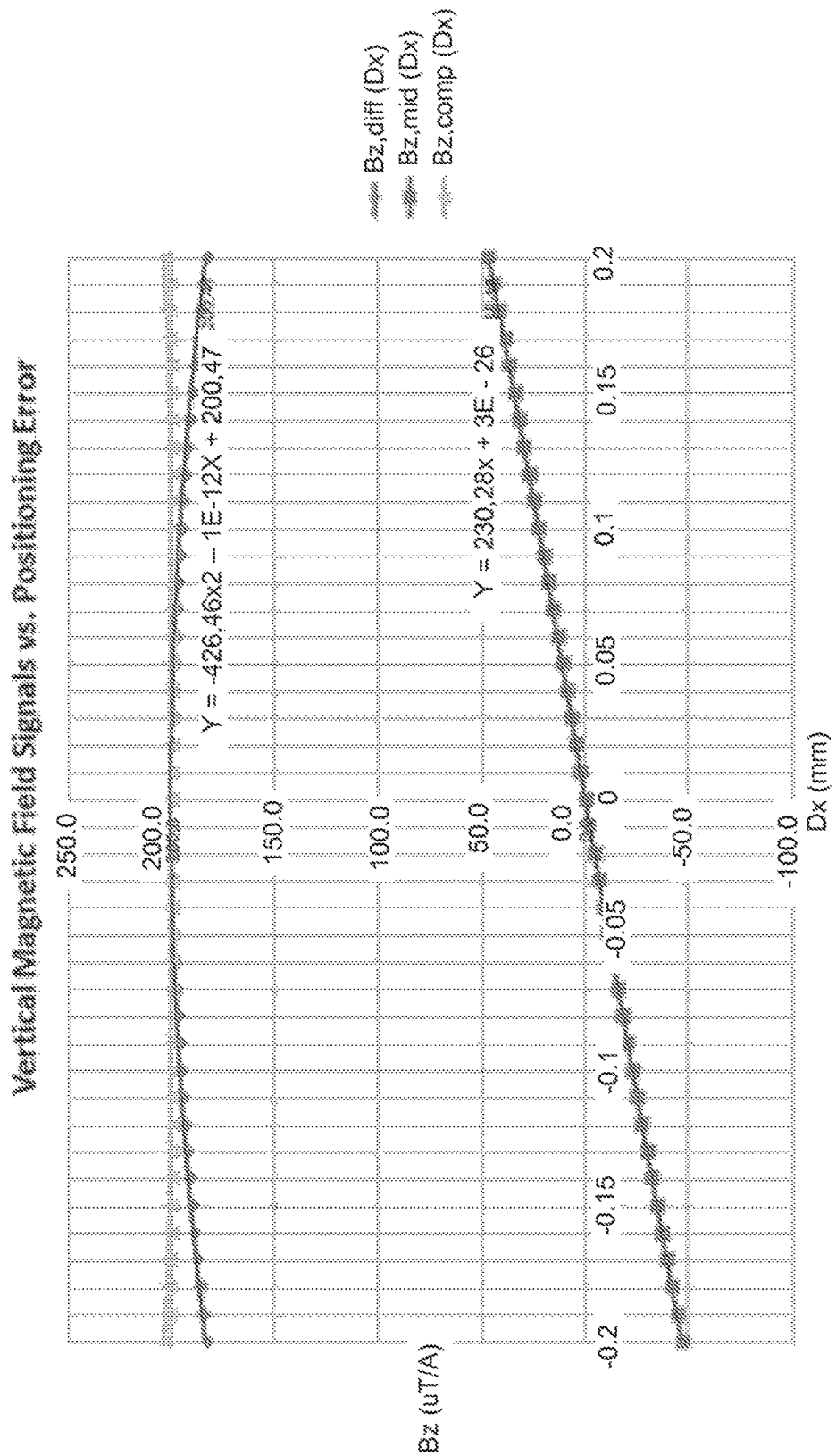
FIG. 9 is a graphical representation that shows an example of a compensated differential magnetic field with respect to horizontal positioning error in relation to a symmetric external current rail.

For a symmetric external current rail 210, (e.g., a straight PCB trace), the target placement for magnetic current sensor 230 may be the center of external current rail 210. FIG. 9 is a graphical representation that shows an example of a compensated vertical differential magnetic field with respect to a horizontal positioning error in relation to a symmetric external current rail 210. As shown in FIG. 9, for a positioning error range of ±200 μm, the vertical differential magnetic field (e.g., represented by the line corresponding to "Bz, diff (Dx)"), may be corrected based on the vertical magnetic field value sensed by auxiliary lateral Hall cell 420 (e.g., represented by the line corresponding to "Bz, mid(Dx)"), in order determine the compensated vertical differential magnetic field (e.g., represented by the line corresponding to "Bz, comp(Dx)") that may be used to derive a corrected vertical differential Hall signal). As shown in FIG. 9, if auxiliary lateral Hall cell 420 is placed between primary Hall cells 410 and if magnetic current sensor 230 is attached exactly on center (e.g., if $\Delta x$=0), then auxiliary lateral Hall cell 420 may sense a vertical magnetic field equal to zero. As shown in FIG. 9, within a particular limit (e.g., −200 μm≤$\Delta x$≤200 μm), the vertical magnetic field value sensed by auxiliary lateral Hall cell 420 is a linear function of the horizontal positioning error. As such, the auxiliary vertical Hall signal (e.g., derived from the vertical magnetic field value sensed by auxiliary lateral Hall cell 420) also behaves linearly. Therefore, it is possible to extract the horizontal positioning error from the auxiliary vertical Hall signal:

$$U_{Aux} = S_{Hall} \cdot B_{z,Aux} = S_{Hall} \cdot \beta \cdot \Delta x \cdot I;$$
$$U_{Main} = S_{Hall} \cdot B_{z,\textit{diff}} = S_{Hall} \cdot (1 - \alpha \cdot \Delta x^2) \cdot S_0 \cdot I;$$
$$\frac{U_{Aux}}{U_{Main}} = \frac{\beta \cdot \Delta x}{(1 - \alpha \cdot \Delta x^2) \cdot S_0} \approx \frac{\beta \cdot \Delta x}{S_0};$$

where $U_{Aux}$ represents the auxiliary vertical Hall signal, $U_{Main}$ represents the vertical differential Hall signal, and where $\alpha$, $\beta$, and $S_0$ represent known constants associated with external current rail 210.

As such, the following correction may be performed, using the auxiliary vertical Hall signal, in order to correct an error that arises in the vertical differential Hall signal due to the horizontal positioning error:

$$U_{Main\,Comp,Symm} =$$

$$S_{Hall} \cdot S_0 \cdot I \approx U_{Main} \cdot (1 + \alpha \cdot \Delta x^2) \approx U_{Main} \cdot \left(1 + \alpha \cdot \left(\frac{S_0 \cdot U_{Aux}}{\beta \cdot U_{Main}}\right)^2\right).$$

In some implementations, a current rail constant (e.g., $c = \alpha^{1/2} \cdot S_0/\beta$) may be stored by magnetic current sensor 230 (e.g., in memory component 340 as an EEPROM constant for the particular external current rail 210). Therefore, based on the vertical differential Hall signal, derived from the vertical magnetic field values sensed by primary Hall cells 410, and the auxiliary vertical Hall signal, derived from the vertical magnetic field value sensed by auxiliary lateral Hall cell 420, magnetic current sensor 230 may evaluate the above formula during operation (e.g., via a hardware modules, a state machine in firmware, etc.) in order to compensate for the horizontal positioning error. As described above, examples of the corrected vertical differential magnetic field for different signal errors that arise due to horizontal positioning error with respect to a symmetric external current rail 210 are shown in FIG. 9 by the line corresponding to "Bz,comp(Dx)". In this way, an auxiliary vertical Hall signal, derived based on a vertical magnetic field value sensed by auxiliary lateral Hall cell 420, may be used to compensate for a vertical differential Hall signal error that arises as a result of a horizontal positioning error associated with a symmetric current rail.

Figure 10:
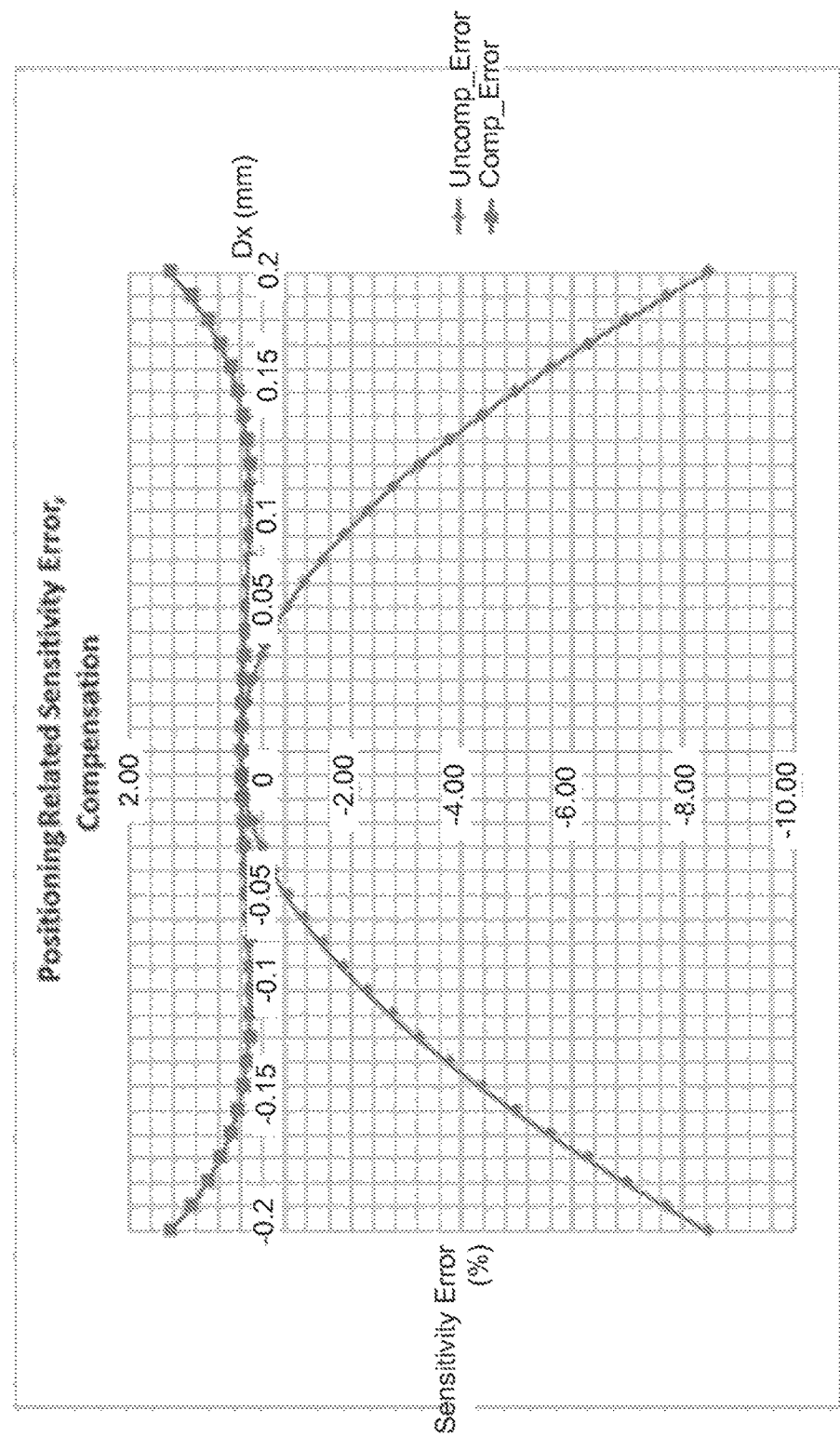
FIG. 10 is a graphical representation of an example of an uncompensated horizontal positioning sensitivity error and a compensated horizontal positioning sensitivity error for a symmetric external current rail.

FIG. 10 is a graphical representation of an example of an uncompensated horizontal positioning sensitivity error and a compensated horizontal positioning sensitivity error for a symmetric external current rail. The uncompensated horizontal positioning sensitivity error in relation to horizontal positioning error is shown by the line corresponding to "Uncomp_Error". The compensated horizontal positioning sensitivity error in relation to horizontal positioning error is shown by the line corresponding to "Comp_Error".

In the case of an asymmetric external current rail 210 (e.g., a current rail with a non-constant width in a direction perpendicular to the current), the maximum vertical differential magnetic field is shifted relative to the center position of the asymmetric external current rail 210. The zero vertical magnetic field point is similarly offset (e.g., whereas the zero vertical magnetic field point is located at x=0 for a symmetric external current rail 210), but the linear behavior of the vertical differential magnetic field with respect to the horizontal positioning error (as described above) holds true.

Figure 11:
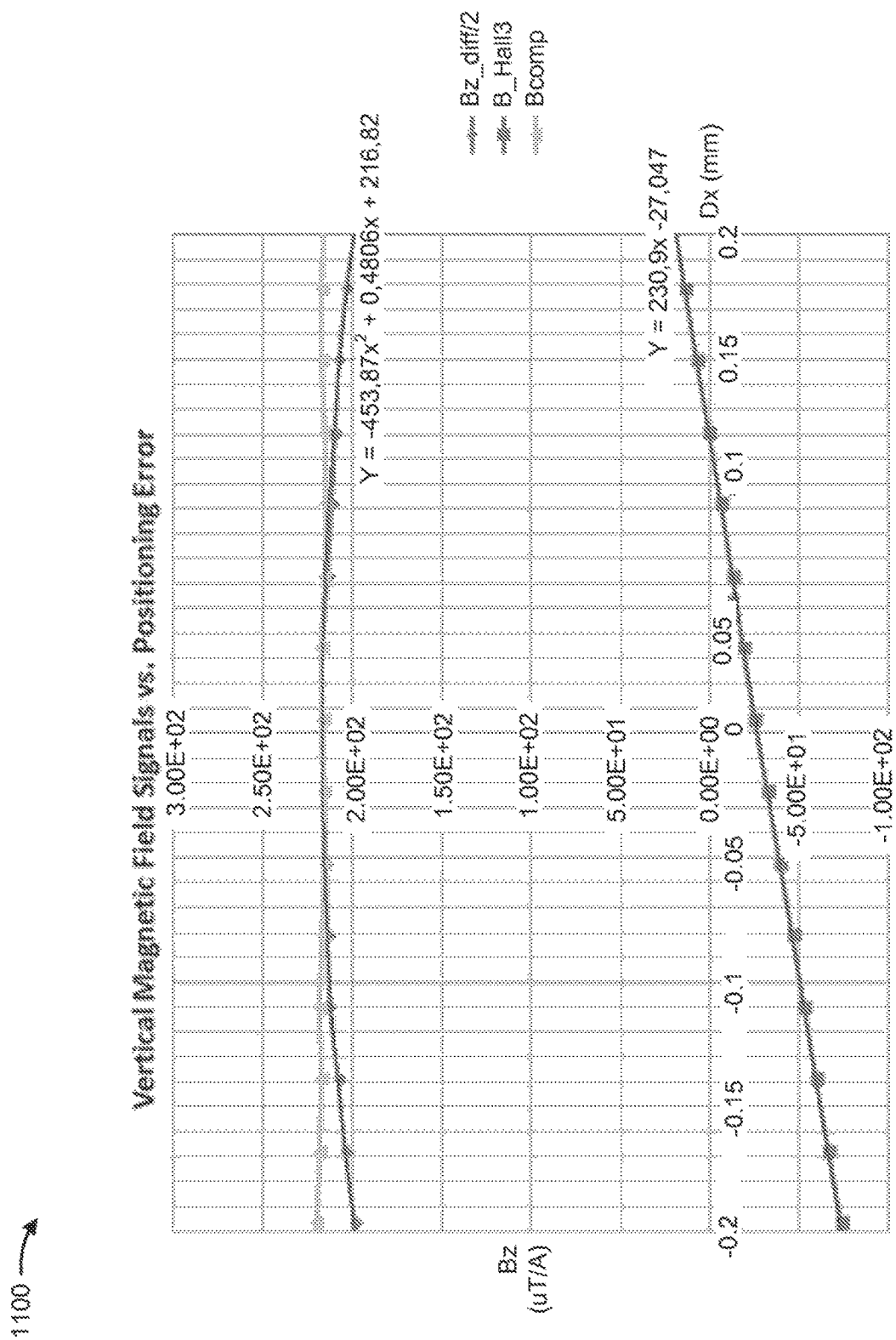
FIG. 11 is a graphical representation that shows an example of a compensated differential magnetic field with respect to horizontal positioning tolerance in relation to an asymmetric current rail.

FIG. 11 is a graphical representation that shows an example of a compensated vertical differential magnetic field with respect to horizontal positioning error in relation to an asymmetric external current rail 210. As shown in FIG. 11, for a horizontal positioning error range of ±200 μm, the vertical differential magnetic field (e.g., represented by the line corresponding to "Bz_diff/2"), may be corrected based on the vertical magnetic field value sensed by auxiliary lateral Hall cell 420 (e.g., represented by the line corresponding to "Bz_Hall3"), in order determine the compensated vertical differential magnetic field (e.g., represented by the line corresponding to "Bcomp") that may be used to derive a corrected vertical differential Hall signal). As shown in FIG. 11, if auxiliary lateral Hall cell 420 is placed between primary Hall cells 410 and if magnetic current sensor 230 is attached exactly on center (e.g., if Δx=0), then auxiliary lateral Hall cell 420 may sense a negative magnetic field value (e.g., since external current rail 210 is asymmetric). As such, a current rail dependent offset (e.g., $\Delta x_0$, particular to geometry of external current rail 210) should be considered when correcting the vertical differential Hall signal error that arises due to the horizontal positioning error:

$$U_{Main\,Comp,Asymm} =$$

$$U_{Main} \cdot (1 + \alpha \cdot \Delta x^2) \approx U_{Main} \cdot \left(1 + \alpha \cdot \left(\frac{S_0 \cdot U_{Aux}}{\beta \cdot U_{Main}} + \Delta x_0\right)^2\right).$$

In some implementations, a set of current rail constants (e.g., $c_1 = \alpha^{1/2} S_0/\beta$, $c_2 = \alpha^{1/2} \cdot \Delta x_0$) may be stored by magnetic current sensor 230 (e.g., as an EEPROM constant for the particular external current rail 210).

Therefore, based on the vertical differential Hall signal, derived from the vertical magnetic field values sensed by primary Hall cells 410, the auxiliary vertical Hall signal, derived from the vertical magnetic field value sensed by auxiliary lateral Hall cell 420, and the current rail dependent offset, magnetic current sensor 230 may evaluate the above formula during operation in order to compensate for the horizontal positioning error. As described above, examples of the corrected vertical differential magnetic field for different signal errors that arise due to horizontal positioning error with respect to an asymmetric external current rail 210 are shown in FIG. 11 by the line corresponding to "Bcomp". In this way, an auxiliary vertical Hall signal, derived based on a vertical magnetic field value sensed by auxiliary lateral Hall cell 420, may be used to compensate for a vertical differential Hall signal error that arises as a result of a horizontal positioning error associated with an asymmetric current rail.

Figure 12:
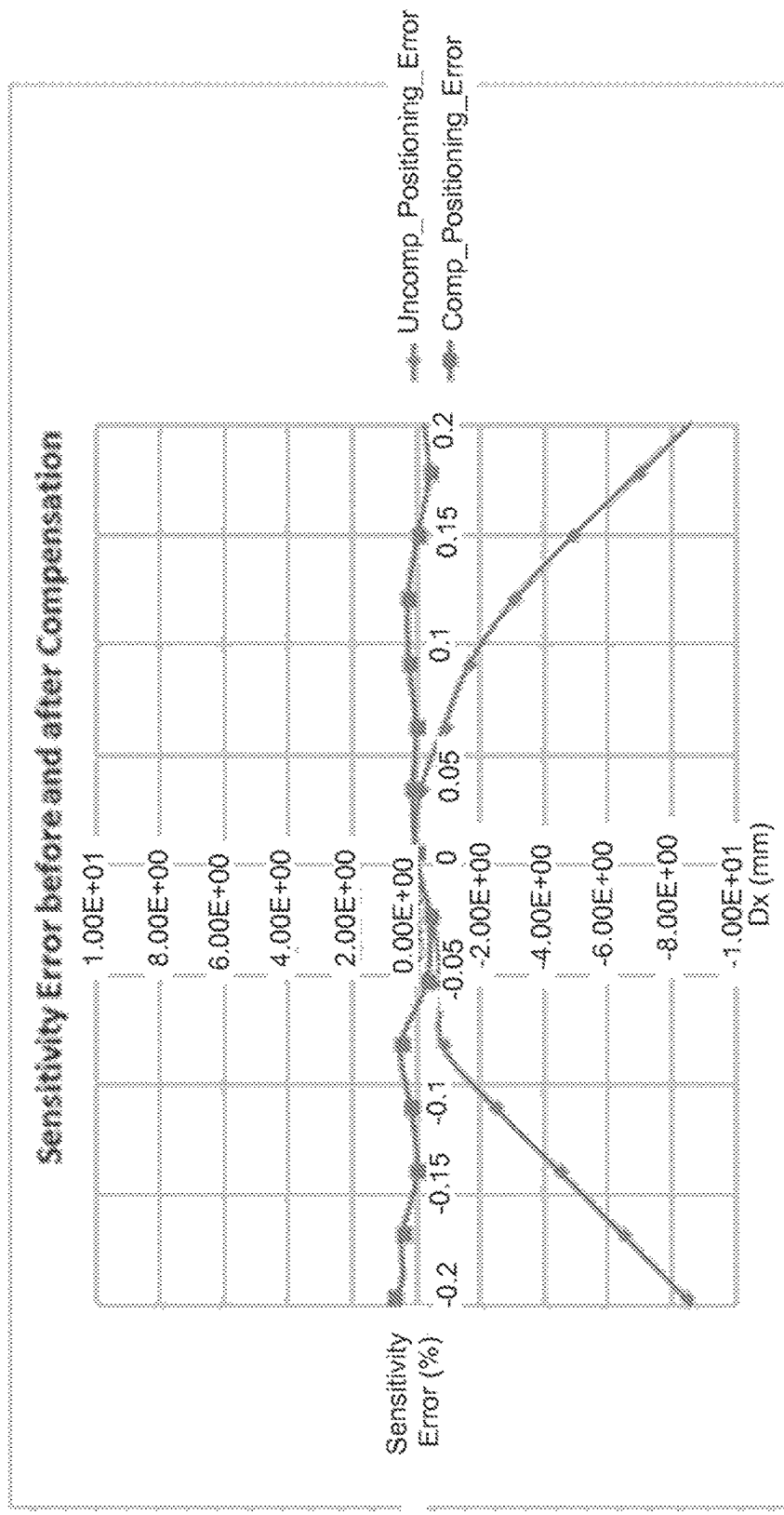
FIG. 12 is a graphical representation of an example of an uncompensated horizontal positioning sensitivity error and a compensated horizontal positioning sensitivity error for an asymmetric external current rail.

FIG. 12 is a graphical representation of an example of an uncompensated horizontal positioning sensitivity error and a compensated horizontal positioning sensitivity error for an asymmetric external current rail. The uncompensated horizontal positioning sensitivity error in relation to position tolerance is shown by the line corresponding to "Uncomp_Positioning_Error". The compensated horizontal positioning sensitivity error in relation to position tolerance is shown by the line corresponding to "Comp_Positioning_Error".

In some implementations, optimal constants (e.g., $c_1 = \alpha^{1/2} \cdot S_0/\beta$, $c_2 = \alpha^{1/2} \cdot \Delta x_0$, where $c_2$ may not be used for a symmetric external current rail 210) may be determined from geometry of external current rail 210 and positioning of primary Hall cells 410 and auxiliary lateral Hall cell 420. For example, fitting the vertical differential Hall signal function and the auxiliary vertical Hall signal function may result in an asymptotically optimal performance. From a practical perspective, the constants may be modified to reach a more desired behavior over a specific Δx region.

In some implementations, the auxiliary vertical Hall signal may be corrected in order to suppress a background field-effect. Implementations described thus far are described in the context of a negligible homogeneous background field (e.g., a background magnetic field significantly less than the vertical differential Hall field). However, if the homogeneous background field is not negligible, then magnetic current sensor 230 may correct the auxiliary vertical Hall signal based on the background field as follows:

$$U_{Aux,Background\_Corrected}=U_{Aux}-(U_{Hall1}+U_{Hall2})/2;$$

where $U_{Aux,Background\_Corrected}$ represents the corrected auxiliary vertical Hall signal, $U_{Aux}$ represents the uncorrected auxiliary vertical Hall signal, $U_{Hall1}$ represents a Hall signal corresponding to a vertical magnetic field sensed by primary Hall cell 410-1, and $U_{Hall2}$ represents a Hall signal corresponding to a vertical magnetic field sensed by primary Hall cell 410-2.

The auxiliary vertical Hall signal correction may require a modification in the analog front-end of magnetic current sensor 230 (e.g., chopping scheme and circuitry). The vertical differential Hall signal is already background field corrected by definition:

$$U_{Main}=(U_{Hall1}-U_{Hall2})/2;$$

where $U_{Main}$ represents the vertical differential Hall signal determined based on the vertical magnetic field values sensed by primary Hall cell 410-1 and primary Hall cell 410-2.

Figure 13:
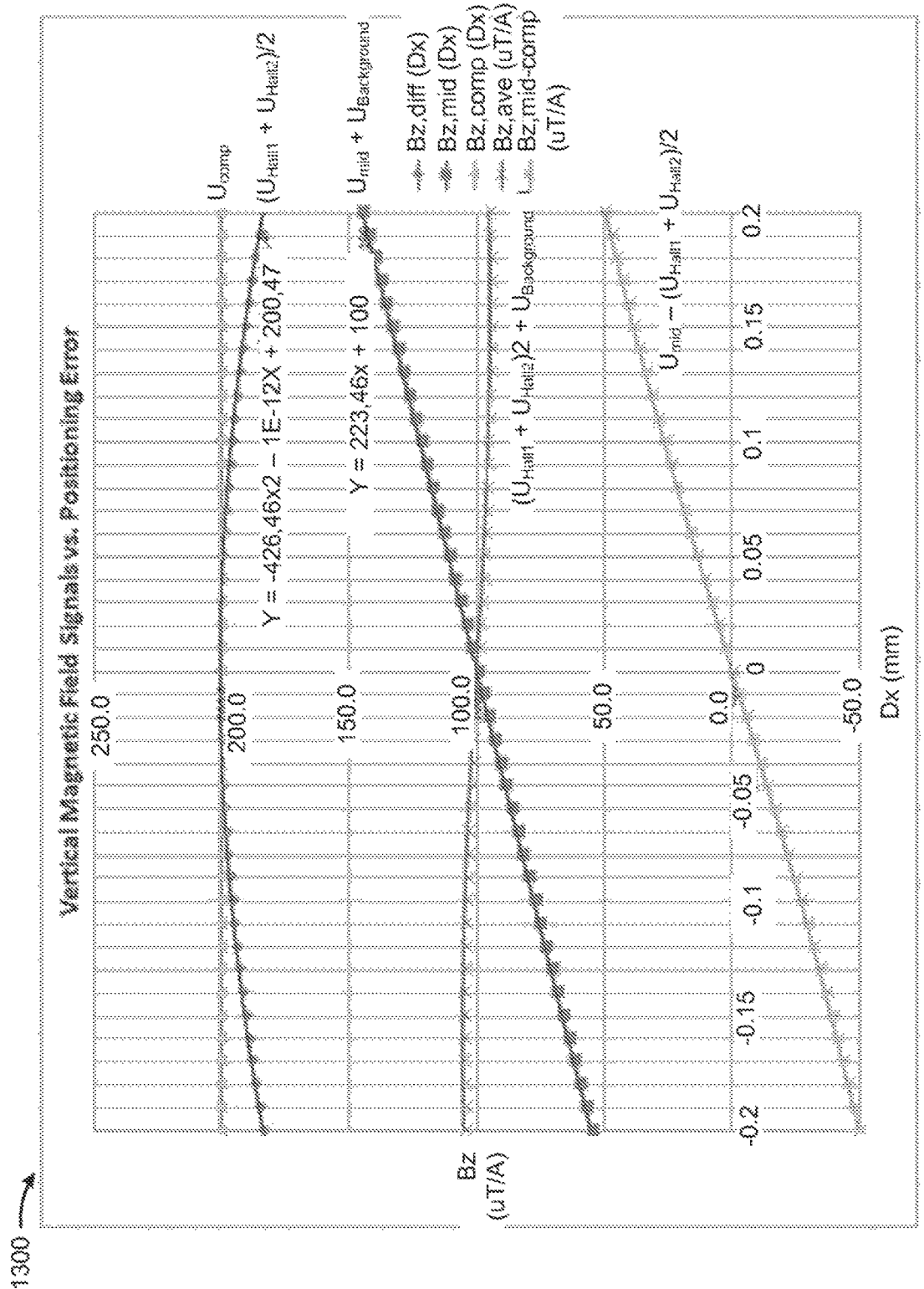
FIG. 13 is a graphical representation of an example of a compensated vertical differential magnetic field with respect to a background field correction.
Figure 14:
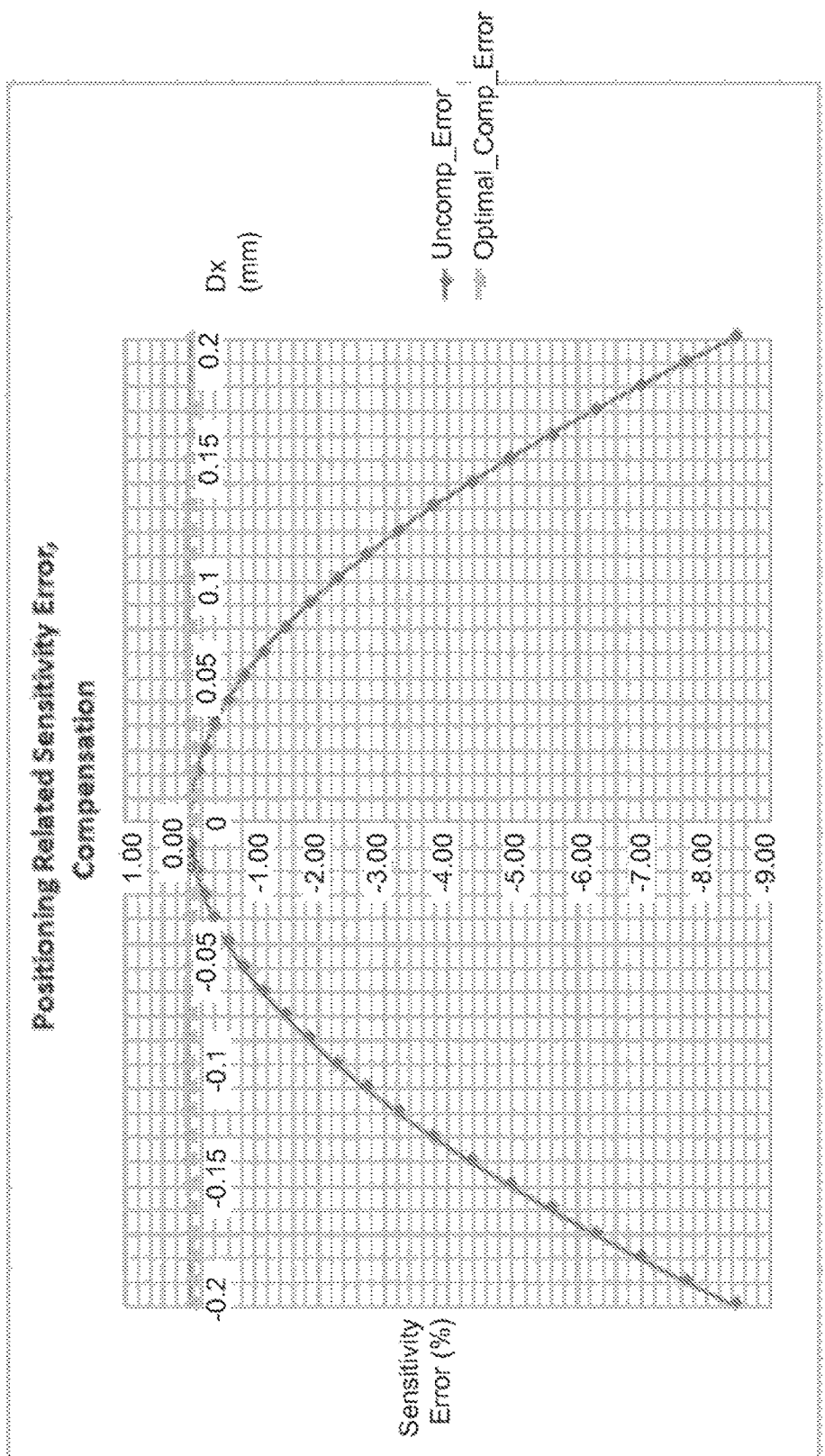
FIG. 14 is a graphical representation of an example of an uncompensated horizontal positioning sensitivity error and a compensated horizontal positioning sensitivity error with respect to a background field correction.

FIG. 13 is a graphical representation of an example of a compensated vertical differential magnetic field with respect to a background field correction. As shown in FIG. 13, the vertical magnetic field value sensed by auxiliary lateral Hall cell 420 (e.g., represented by the line corresponding to "Bz_mid (Dx)") may be corrected by using background field correction function (e.g., represented by the line corresponding to "Bz,ave (uT/A") in order to determine a background corrected auxiliary vertical magnetic field value (e.g., represented by the line corresponding to "Bz,mid-comp(uT/A)"). The vertical differential magnetic field (e.g., represented by the line corresponding to "Bz,diff(Dx)") may then be corrected based on the background corrected auxiliary vertical magnetic field value in order to determine the corrected vertical differential magnetic field (e.g., represented by the line corresponding to "Bz,comp(Dx)"). FIG. 14 is a graphical representation of an example of an uncompensated horizontal positioning sensitivity error and a compensated horizontal positioning sensitivity error with respect to a background field correction. The uncompensated horizontal positioning sensitivity error in relation to a non-negligible background field is shown by the line corresponding to "Uncomp_Error". The compensated horizontal positioning sensitivity error in relation to a non-negligible background field is shown by the line corresponding to "Optimal_Comp_Error".

In some implementations, after determining the corrected vertical differential Hall signal that compensates for the horizontal positioning error, magnetic current sensor 230 (e.g., DSP 330, differential Hall component 310) may determine the amount of current passing through external current rail 210 based on the corrected vertical differential Hall signal, as described above. Magnetic current sensor 230 may also provide (e.g., via digital interface 350) information associated with the amount of current and/or other information sensed, determined, and/or derived by magnetic current sensor 230 (e.g., information associated with the corrected vertical differential Hall signal, information associated with the auxiliary vertical Hall signal, etc.).

Additionally, or alternatively. (e.g., after determining the vertical differential Hall signal that compensates for the horizontal positioning error, without determining the vertical differential Hall signal that compensates for the horizontal positioning error) magnetic current sensor 230 may determine a corrected vertical differential Hall signal that compensates for a vertical positioning error associated with attaching magnetic current sensor 230 in a position relative to external current rail 230.

As described above, in some implementations, a vertical positioning error may occur when attaching magnetic current sensor 230 in a position relative to external current rail 210. For example, a vertical positioning error may occur when magnetic current sensor 230 is attached such that a distance (e.g., in the z-direction perpendicular to the face of external current rail 210) between primary Hall cells 410 and the face of external current rail 210 is greater than or less than a known distance (e.g., $z_0$) by an unknown amount (e.g., $\Delta z$). For example, a vertical positioning tolerance, combined with non-coplanarity of leads, may allow magnetic current sensor 230 to be placed such that $\Delta z$ is equal to a value up to ±65 μm, thus introducing a vertical positioning error. Moreover, additional variations of $\Delta z$ (e.g., ±5 μm) may occur due to swelling associated with magnetic current sensor 230 (e.g., after magnetic current sensor 230 is attached to external current rail 210). In some cases, the vertical differential Hall signal derived from the vertical magnetic field values sensed by primary Hall cells 410 may be influenced by the vertical positioning error as follows:

$$U_{differential-Hall}(0,z_0+\Delta z)=S_{Hall} \cdot B_{z,diff}(0,z_0+\Delta z)$$

where $U_{differential-Hall}(0,z_0+\Delta z)$ represents a differential Hall signal (e.g., in mV) at horizontal distance zero from the symmetrical center of external current rail 210 and an unknown vertical distance to $+\Delta z$, $S_{Hall}$ represents a signal conversion factor (e.g., in mV/μT), and $B_{z,diff}(0,z_0+\Delta z)$ represents a magnetic field at horizontal distance zero from the symmetrical center of external current rail 210 and the unknown vertical distance $z_0+\Delta z$ from external current rail 210 (e.g., in μT).

Figure 15:
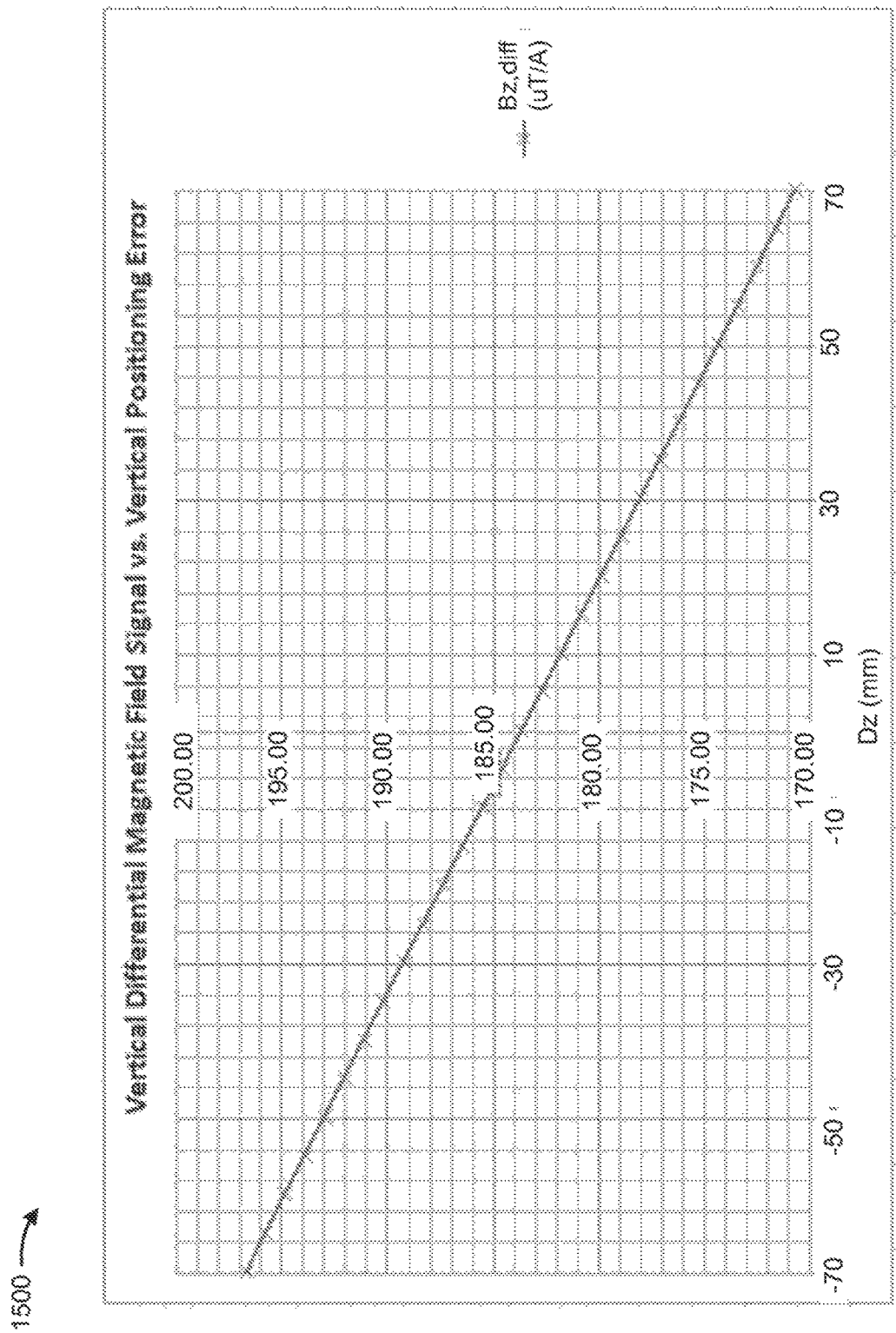
FIG. 15 is a diagram that shows an example of dependency of a vertical differential magnetic field, sensed by a set of primary Hall cells, with respect to a vertical positioning error.

As such, the vertical positioning error may affect the vertical differential Hall signal derived by magnetic current sensor 230. FIG. 15 shows an example of a dependency of the vertical differential magnetic field, sensed by primary Hall cells 410 with respect to the vertical positioning error, from $\Delta z=-70.0$ μm to $\Delta z=70.0$ μm. As shown, as the positioning error (e.g., $\Delta z$) moves further from zero, the vertical differential magnetic field (e.g., used to derive the vertical differential Hall signal) may be affected. As shown, if the vertical positioning error is equal to ±65 μm, then the vertical differential magnetic field may be affected (e.g., be increased or be decreased) by approximately ±6.6% (e.g., by increasing from approximately 184 microTeslas/Amp (μT/A) to approximately 196 μT/A or by decreasing from approximately 184 μT/A to approximately 172 μT/A). As shown, the sensitivity error is linear over $\Delta z$. Unless a correction is applied in order to compensate for the vertical positioning error, the vertical positioning error will result in a similar decrease in the vertical differential Hall signal derived based on the sensed vertical magnetic field values associated with the vertical differential magnetic field. The signal sensitivity decrease resulting from the vertical positioning error may be compensated for with the inclusion of a set of auxiliary vertical Hall cells 430. In some implementations, the set of auxiliary vertical Hall cells 430 may sense a set of horizontal magnetic field values at locations adjacent to primary Hall cells 410, and the set of horizontal magnetic field values may be used to compensate for the vertical positioning error in the vertical differential Hall signal.

A back-bias independent vertical differential Hall field may be determined based on the vertical magnetic field values sensed by primary Hall cells 410 as follow:

$$B_{z,diff}(0, z0 + \Delta z) = \frac{B_{z,left}(0, z_0 + \Delta z) - B_{z,right}(0, z_0 + \Delta z)}{2}.$$

Additionally, it is possible to determine a magnetic field value that represents the inhomogeneity of the horizontal magnetic field (e.g., $B_{x,inh}(0, z_0+\Delta z)$) based on the horizontal magnetic field values sensed by the set of auxiliary vertical Hall cells 430:

$$B_{x,inh}(0, z_0 + \Delta z) =$$
$$B_{x,center}(0, z_0 + \Delta z) - \frac{B_{x,left}(0, z_0 + \Delta z) + B_{x,right}(0, z_0 + \Delta z)}{2};$$

where $B_{x,center}(0, z_0+\Delta z)$ represents the horizontal magnetic field value sensed by auxiliary vertical Hall cell 430-3, $B_{x,left}(0, z_0+\Delta z)$ represents the horizontal magnetic field value sensed by auxiliary vertical Hall cell 430-1, and $B_{x,right}(0, z_0+\Delta z)$ represents the horizontal magnetic field value sensed by auxiliary vertical Hall cell 430-2. $B_{x,inh}(0, z_0+\Delta z)$ is also background field compensated, and dependent on $\Delta z$ (e.g., more so than $B_{z,diff}(0, z_0+\Delta z)$).

As such, it is possible to determine a linear combination of the two independent magnetic fields that is $\Delta z$ invariant while remaining proportional to the current passing through external current rail 210:

$$B_{combined}(0, z_0+\Delta z) = C \times B_{z,diff}(0, z_0+\Delta z) - B_{x,inh}(0, z_0+\Delta z)$$
$$\approx B_{combined}(0, z_0);$$

where $B_{combined}(0, z_0)$ is a combined magnetic field value that compensate for vertical positioning error $\Delta z$, and C is a current rail constant, associated with external current rail 210 and the Hall-cell arrangement, determined based on w, $z_0$, and $d_T$.

Notably, in some implementations, the set of auxiliary vertical Hall cells 430 may not include auxiliary vertical Hall cell 430-2 (e.g., shown as optional in FIGS. 4B and 4C). In such a case, $B_{x,inh}(0, z_0+\Delta z)$ may be determined as follows:

$$B_{x,inh}'(0, z_0+\Delta z) = B_{x,center}(0, z_0+\Delta z) - B_{x,left}(0, z_0+\Delta z).$$

However, by auxiliary vertical Hall cell 430-2, symmetry between the horizontal magnetic field values may be achieved, in addition to additional robustness against horizontal positioning error (e.g., $\Delta x$).

Figure 16:
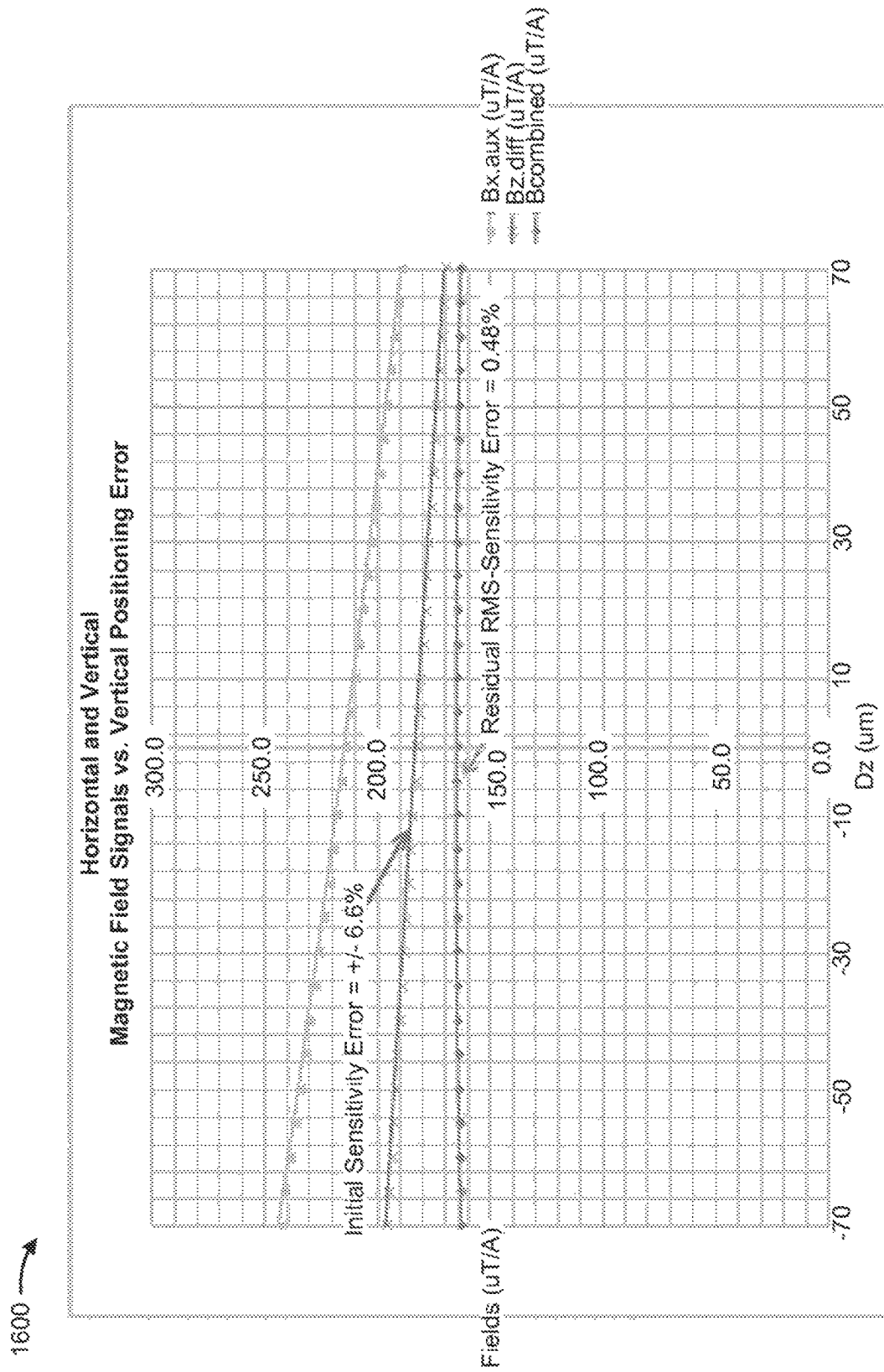
FIG. 16 is a graphical representation of an example of a combined magnetic field, determined based on a vertical differential magnetic field and a horizontal magnetic field, that is independent of vertical positioning error.

FIG. 16 is a graphical representation that shows an example of a combined magnetic field, determined based on a vertical differential magnetic field and a horizontal magnetic field, that is independent of vertical positioning error. As shown, for a vertical positioning error range of ±70 μm, the vertical differential magnetic field (e.g., represented by the line corresponding to "Bz,diff(μT/A)"), may be combined with the horizontal magnetic field value that represents the inhomogeneity of the horizontal magnetic field (e.g., represented by the line corresponding to "Bx,aux(μT/A)"), in order determine a combined magnetic field value (e.g., represented by the line corresponding to "Bcombined (μT/A)") that has been corrected to compensate for vertical positioning error, and may be used to derive a corrected vertical differential Hall signal).

In some implementations, a horizontal differential Hall signal (e.g., $U_{x,inh}$) that represents the differential magnetic field value that corresponds to the inhomogeneity of the horizontal magnetic field (e.g., $B_{x,inh}$) may be derived in an analog front-end of magnetic current sensor 230 (e.g., similar to the manner in which $U_{z,diff}$, corresponding to $B_{z,diff}$, is derived, as described above). Magnetic current sensor 230 may then combine the derived Hall signals (e.g., $U_{x,inh}$ and $U_{z,diff}$).

Figure 17A:
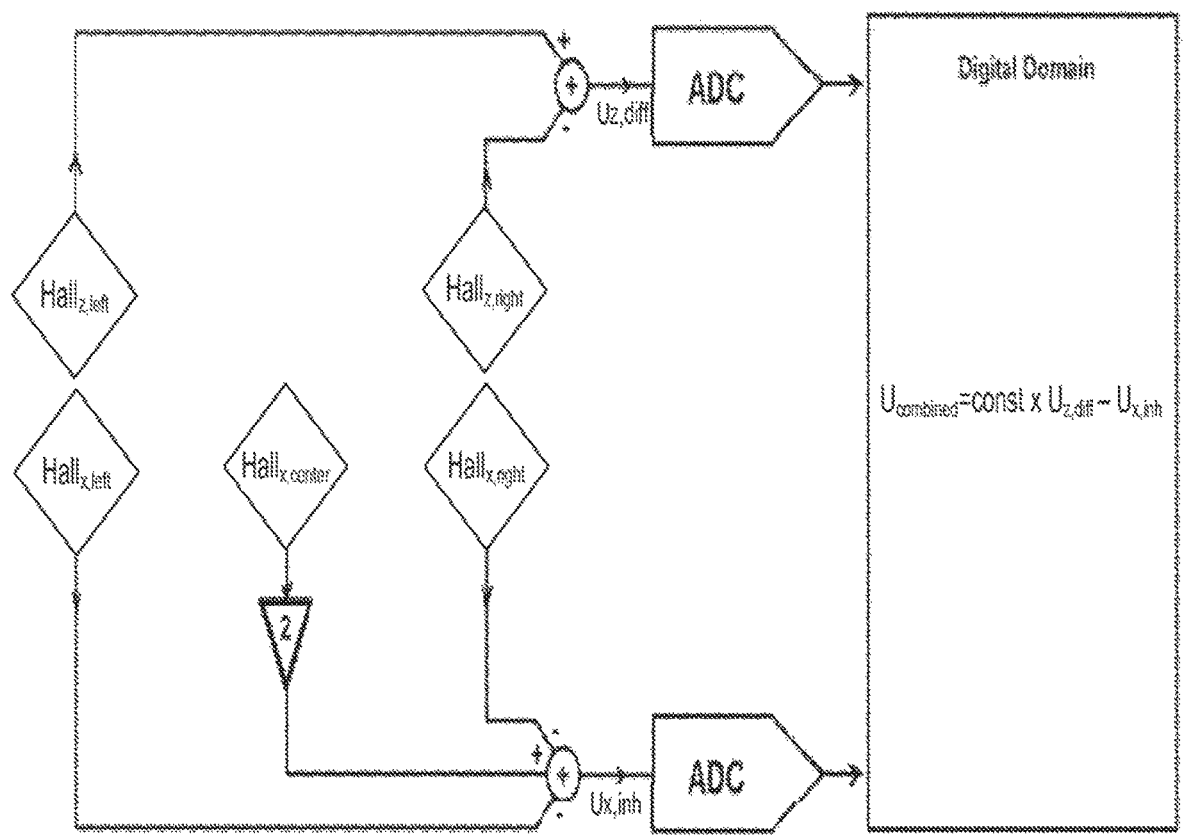
FIGS. 17A and 17B are block diagrams showing example circuitry associated with combining a vertical differential Hall signal and an auxiliary horizontal Hall signal in order to compensate for a vertical positioning error.

In some implementations, magnetic current sensor 230 (e.g., DSP 330) may be designed to combine the derived Hall signals after analog-to-digital conversion is performed on the derived Hall signals (e.g., by ADC 320). FIG. 17A is a block diagram showing example circuitry associated with combining the derived Hall signals (e.g., the vertical differential Hall signal and the auxiliary horizontal Hall signal), in order to compensate for a vertical positioning error, after analog-to-digital conversion is performed on the derived Hall signals. As shown, analog-to-digital conversion may be separately performed on each derived Hall signal, and the converted derived Hall signals may be combined in the digital domain (e.g., using a geometry dependent EEPROM constant associated with external current rail 210).

Figure 17B:
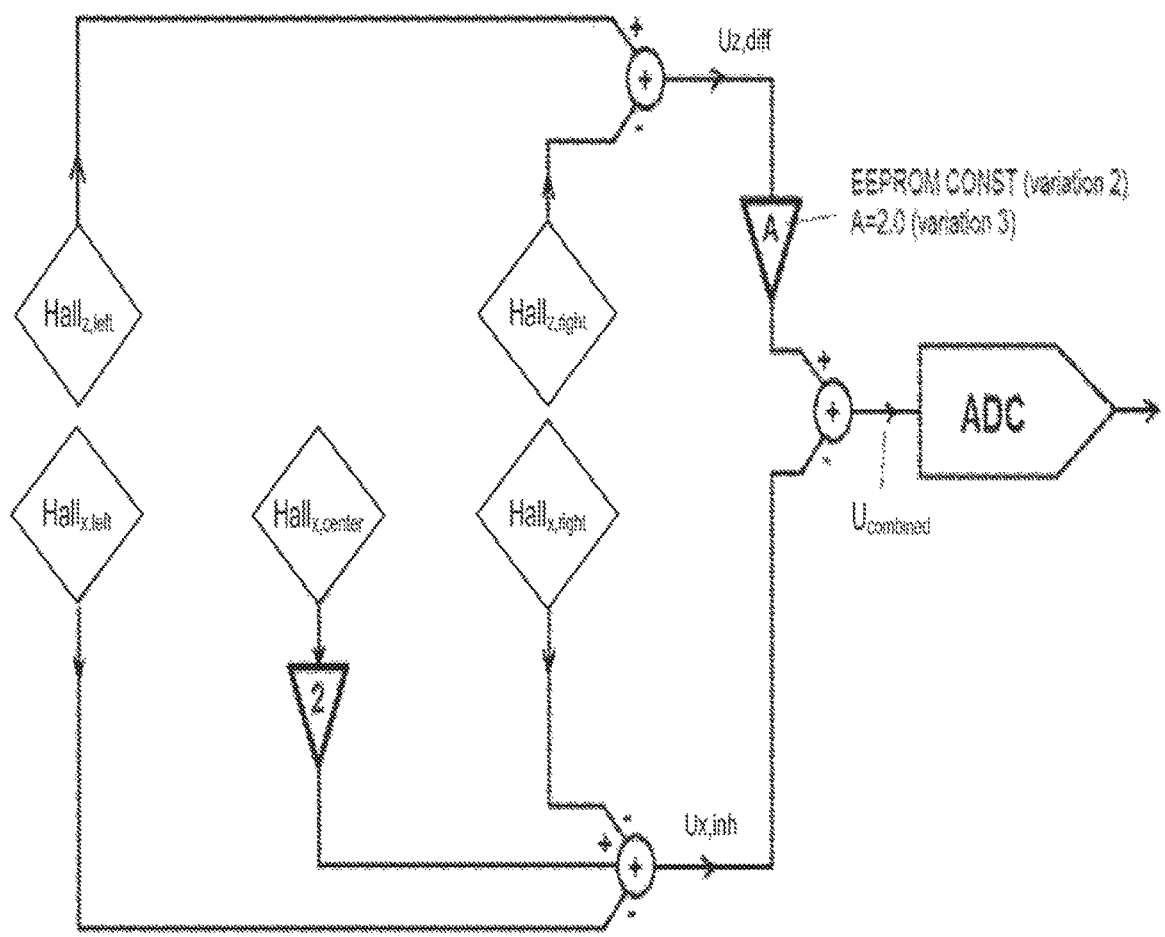

Alternatively, magnetic current sensor 230 may be designed to combine the derived Hall signals before analog-to-digital conversion is performed on the derived Hall signals. FIG. 17B is a block diagram showing example circuitry associated with combining the derived Hall signals, in order to compensate for a vertical positioning error, before analog-to-digital conversion is performed on the derived Hall signals. As shown, magnetic current sensor 230 may be designed such that the derived Hall signals are combined in the analog domain. Magnetic current sensor 230 (e.g., ADC 320) may then perform analog-to-digital conversion on the combined Hall signal. For example, the derived signals may be combined in the analog domain by implementing a programmable gain amplifier that is configured based on the geometry dependent EEPROM constant (e.g., EEPROM CONST, shown as variation 2). As another example, the derived signals may be combined in the analog domain by implementing a hard wired constant value (e.g., A=2.0, shown as variation 3) when external current rail 210 has a particular geometry to reach a $\Delta z$-invariant behavior of $2 \times U_{z,diff} - U_{x,inh}$.

In some implementations, magnetic current sensor 230 may correct the vertical differential Hall signal for both horizontal positioning error and vertical positioning error (e.g., by implementing auxiliary lateral Hall cell 420, and a set of auxiliary vertical Hall cells 430), as described below with regard to FIGS. 18A and 18B.

Figure 18A:
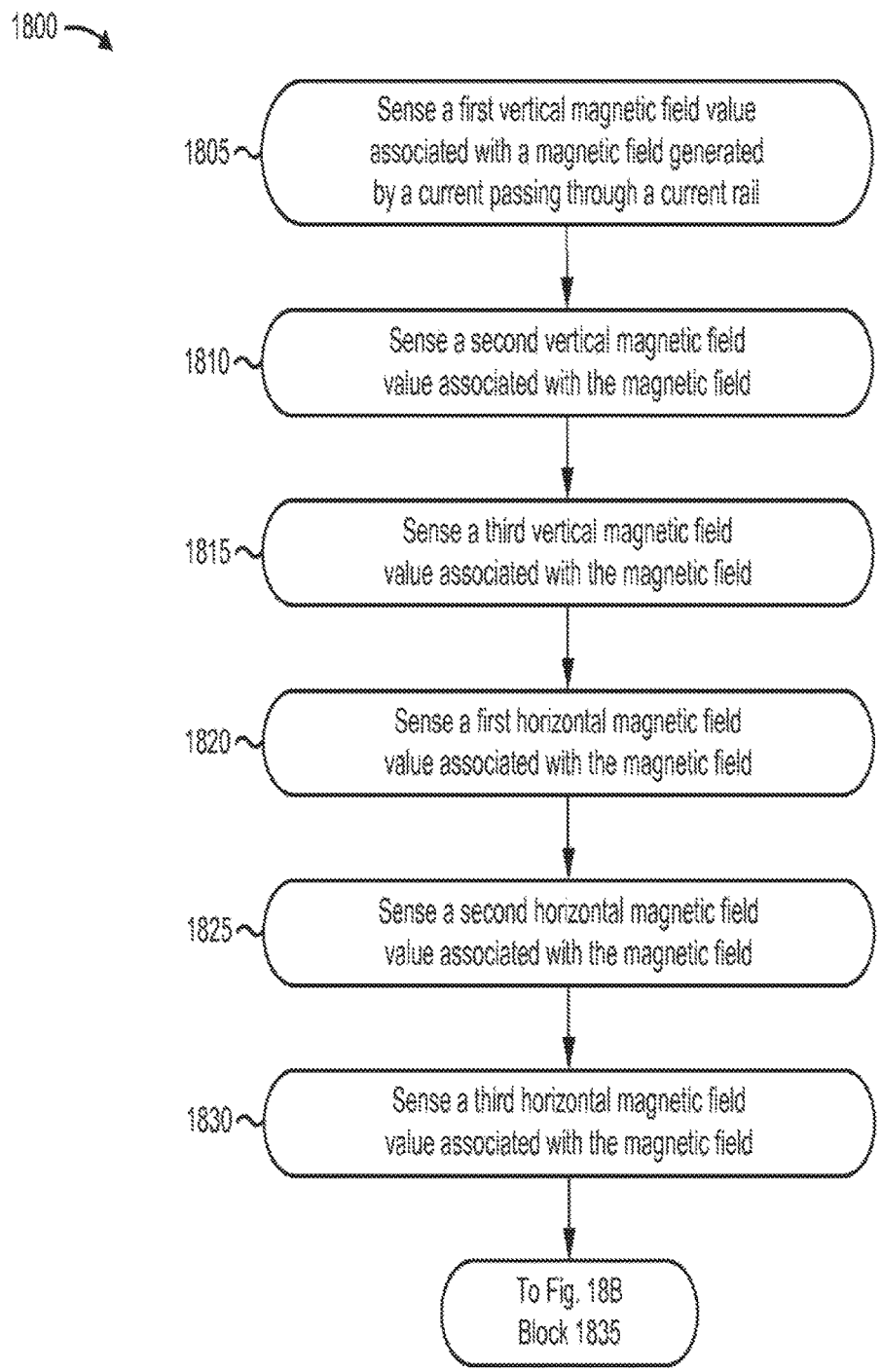
FIGS. 18A and 18B are flow charts of an example process for determining an amount of current, associated with a current passing through a current rail, using a differential Hall signal that has been corrected in order to compensate for a horizontal positioning error and a vertical positioning error associated with attaching a current sensor to the current rail.
Figure 18B:
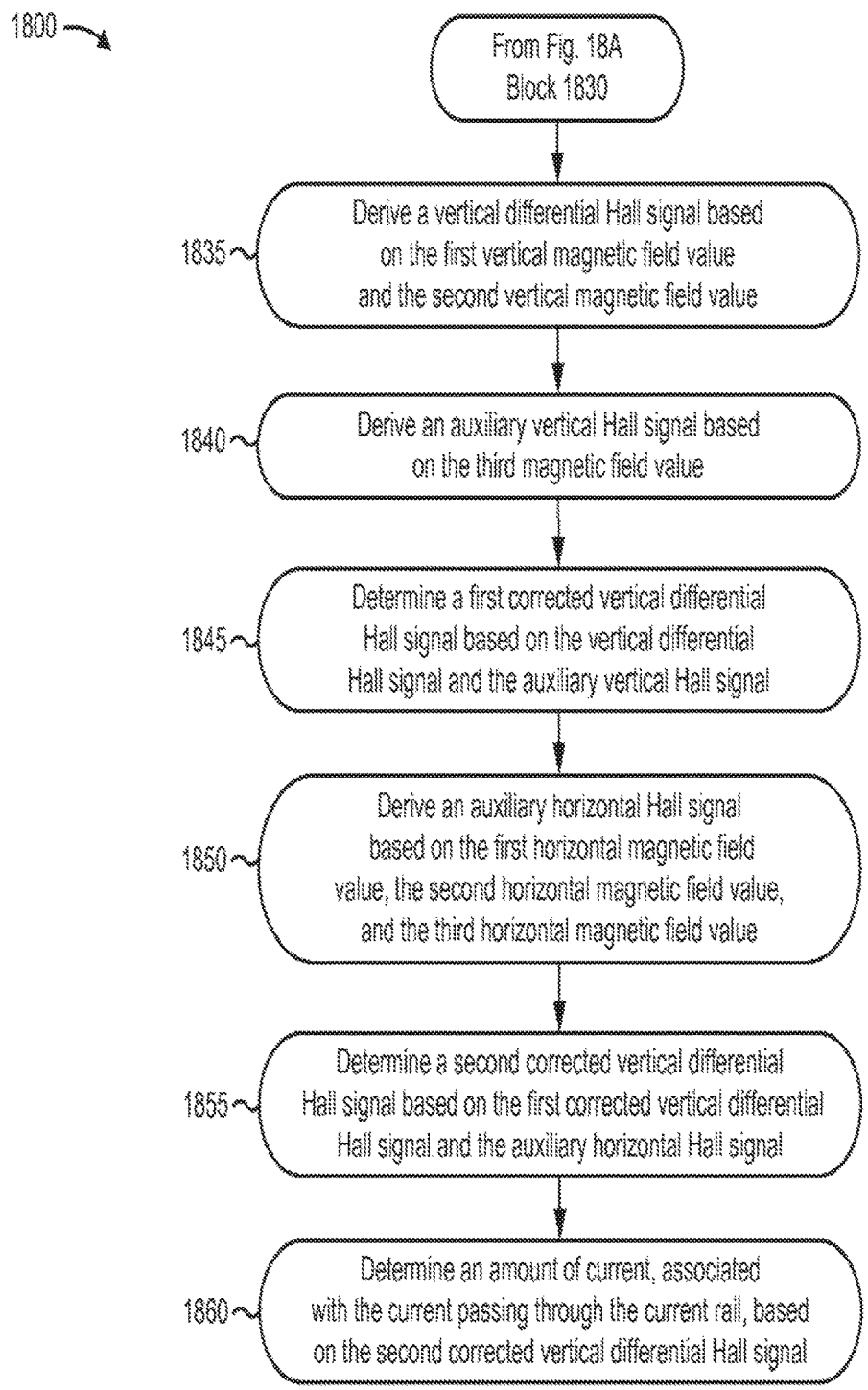

FIGS. 18A and 18B are flow charts of an example process 1800 for determining an amount of current, associated with a current passing through a current rail, using a differential Hall signal that has been corrected in order to compensate for a horizontal positioning error and a vertical positioning error associated with attaching a current sensor to the current rail. In some implementations, one or more process blocks of example process 1800 may be performed by magnetic current sensor 230. In some implementations, one or more process blocks may be performed by a device other than magnetic current sensor 230, such as a processor connected to magnetic current sensor 230.

As shown in FIG. 18A, process 1800 may include sensing a first vertical magnetic field value associated with a magnetic field generated by a current passing through a current rail (block 1805). For example, magnetic current sensor 230 (e.g., primary Hall cell 410-1) may sense a first vertical magnetic field value associated with a magnetic field generated by a current passing through a current rail, as described above.

As further shown in FIG. 18A, process 1800 may include sensing a second vertical magnetic field value associated with the magnetic field (block 1810). For example, magnetic current sensor 230 (e.g., primary Hall cell 410-2) may sense a second vertical magnetic field value associated with the magnetic field, as described above.

As further shown in FIG. 18A, process 1800 may include sensing a third vertical magnetic field value associated with the magnetic field (block 1815). For example, magnetic current sensor 230 (e.g., auxiliary lateral Hall cell 420) may sense a third vertical magnetic field value associated with the magnetic field, as described above.

As further shown in FIG. 18A, process 1800 may include sensing a first horizontal magnetic field value associated with the magnetic field (block 1820). For example, magnetic current sensor 230 (e.g., auxiliary vertical Hall cell 430-1) may sense a first horizontal magnetic field value associated with the magnetic field, as described above.

As further shown in FIG. 18A, process 1800 may include sensing a second horizontal magnetic field value associated with the magnetic field (block 1825). For example, magnetic current sensor 230 (e.g., auxiliary vertical Hall cell 430-2) may sense a second horizontal magnetic field value associated with the magnetic field, as described above.

As further shown in FIG. 18A, process 1800 may include sensing a third horizontal magnetic field value associated with the magnetic field (block 1830). For example, magnetic current sensor 230 (e.g., auxiliary vertical Hall cell 430-3) may sense a third horizontal magnetic field value associated with the magnetic field, as described above.

As shown in FIG. 18B, process 1800 may include deriving a vertical differential Hall signal based on the first vertical magnetic field value and the second vertical magnetic field value (block 1835). For example, magnetic current sensor 230 (e.g., DSP 330, differential Hall component 310, etc.) may derive a vertical differential Hall signal based on the first vertical magnetic field value and the second vertical magnetic field value. In some implementations, magnetic current sensor 230 may derive the vertical differential Hall signal based on providing the first vertical magnetic field value, the second vertical magnetic field value, and a signal conversion factor as inputs to a function that provides, as an output, the vertical differential Hall signal, as described above.

As further shown in FIG. 18B, process 1800 may include deriving an auxiliary vertical Hall signal based on the third vertical magnetic field value (block 1840). For example, magnetic current sensor 230 (e.g., DSP 330, differential Hall component 310, etc.) may derive an auxiliary vertical Hall signal based on the third vertical magnetic field value. In some implementations, magnetic current sensor 230 may derive the auxiliary vertical Hall signal based on providing the third vertical magnetic field value and a signal conversion factor as inputs to a function that provides, as an output, the auxiliary vertical Hall signal, as described above.

As further shown in FIG. 18B, process 1800 may include determining a first corrected vertical differential Hall signal based on the vertical differential Hall signal and the auxiliary vertical Hall signal (block 1845). For example, magnetic current sensor 230 (e.g., DSP 330, differential Hall component 310, etc.) may determine a first corrected vertical differential Hall signal based on the vertical differential Hall signal and the auxiliary vertical Hall signal. In some implementations, magnetic current sensor 230 may determine the first corrected vertical differential Hall signal based on providing the vertical differential Hall signal, the auxiliary vertical Hall signal, a set of known current rail constants, and/or a current rail dependent offset (e.g., in the case of an asymmetric external current rail 210) as inputs to a function that provides, as an output, the first corrected vertical differential Hall signal, as described above.

Additionally. or alternatively, magnetic current sensor 230 may determine a horizontal positioning error, associated with attaching magnetic current sensor 230 in a position relative to external current rail 210, based on the auxiliary vertical Hall signal and the vertical differential Hall signal, as described above. In some implementations, magnetic current sensor 230 may provide and/or store information associated with the horizontal positioning error.

As further shown in FIG. 18B, process 1800 may include deriving an auxiliary horizontal Hall signal based on the first horizontal magnetic field value, the second horizontal magnetic field value, and the third horizontal magnetic field value (block 1850). For example, magnetic current sensor 230 (e.g., DSP 330, differential Hall component 310, etc.) may derive an auxiliary horizontal Hall signal based on the first horizontal magnetic field value, the second horizontal magnetic field value, and the third horizontal magnetic field value. In some implementations, magnetic current sensor 230 may derive the auxiliary horizontal Hall signal based on providing the first horizontal magnetic field value, the second horizontal magnetic field value, the third horizontal magnetic field value, and a signal conversion factor as inputs to a function that provides, as an output, the auxiliary horizontal Hall signal, as described above.

As further shown in FIG. 18B, process 1800 may include determining a second corrected vertical differential Hall signal based on the first corrected vertical differential Hall signal and the auxiliary horizontal Hall signal (block 1855). For example, magnetic current sensor 230 (e.g., DSP 330, differential Hall component 310, etc.) may determine a second corrected vertical differential Hall signal based on the first corrected vertical differential Hall signal and the auxiliary horizontal Hall signal. In some implementations, magnetic current sensor 230 may determine the second corrected vertical differential Hall signal based on providing the first corrected vertical differential Hall signal, the auxiliary horizontal Hall signal, and/or other information as inputs to a function that provides, as an output, the second corrected vertical differential Hall signal, as described above.

Additionally, or alternatively, magnetic current sensor 230 may determine a vertical positioning error, associated with attaching magnetic current sensor 230 in a position relative to external current rail 210, based on the auxiliary horizontal Hall signal and the first corrected vertical differential Hall signal, as described above. In some implementations, magnetic current sensor 230 may provide and/or store information associated with the vertical positioning error.

As further shown in FIG. 18B, process 1800 may include determining an amount of current, associated with the current passing through the current rail, based on the second corrected vertical differential Hall signal (block 1860). For example, magnetic current sensor 230 (e.g., DSP 330, differential Hall component 310, etc.) may determine an amount of current, associated with the current passing through external current rail 210, based on the second corrected vertical differential Hall signal. In some implementations, magnetic current sensor 230 may determine the amount of current based on providing the second corrected vertical differential Hall signal as an input to a function that provides, as an output, the amount of current passing through external current rail 210. In some implementations, current sensor 230 may provide and/or store information that identifies the amount of current.

Although FIGS. 18A and 18B show example blocks of process 1800, in some implementations, process 1800 may include additional blocks, fewer blocks, different blocks, or differently arranged blocks than those depicted in FIGS. 18A and 18B. Additionally. or alternatively, two or more of the blocks of process 1800 may be performed in parallel.

Implementations described herein may provide a magnetic current sensor that includes one or more auxiliary Hall cells, positioned with respect to two primary Hall cells, that may sense magnetic field values, associated with a magnetic field generated by a current passing through a current rail. Information associated with the magnetic field values sensed by the one or more auxiliary Hall cells may then be used to correct a differential Hall signal error that arises due to a horizontal positioning error and/or a vertical positioning error associated with attaching the magnetic current sensor in a position relative to the current rail.

The foregoing disclosure provides illustration and description, but is not intended to be exhaustive or to limit the implementations to the precise form disclosed. Modifications and variations are possible in light of the above disclosure or may be acquired from practice of the implementations.

Even though particular combinations of features are recited in the claims and/or disclosed in the specification, these combinations are not intended to limit the disclosure of possible implementations. In fact, many of these features may be combined in ways not specifically recited in the claims and/or disclosed in the specification. Although each dependent claim listed below may directly depend on only one claim, the disclosure of possible implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Furthermore, as used herein, the term "set" is intended to include one or more items, and may be used interchangeably with "one or more." Where only one item is intended, the term "one" or similar language is used. Also, as used herein, the terms "has," "have," "having," or the like are intended to be open-ended terms. Further, the phrase "based on" is intended to mean "based, at least in part, on" unless explicitly stated otherwise.

What is claimed is:

1. A magnetic current sensor, comprising:
   a first primary Hall cell to sense a first magnetic field value,
     the first magnetic field value being associated with a magnetic field generated by a current passing through a current rail;
   a second primary Hall cell to sense a second magnetic field value,
     the second magnetic field value being associated with the magnetic field generated by the current passing through the current rail, and
     the second primary Hall cell being positioned along an axis at a first distance from the first primary Hall cell,
       the axis being in a direction substantially perpendicular to the current passing through the current rail, and
     a midpoint of the current rail and a midpoint of the first distance between the first primary Hall cell and the second primary Hall cell not being aligned and being separated by a particular distance along the axis; and
   an auxiliary Hall cell to sense a third magnetic field value,
     the auxiliary Hall cell being positioned along the axis at a second distance from the first primary Hall cell,
       the second distance being less than the first distance such that the auxiliary Hall cell is positioned along the axis and between the first primary Hall cell and the second primary Hall cell, and
     the auxiliary Hall cell being positioned off the midpoint of the current rail, and
     the first magnetic field value, the second magnetic field value, and the third magnetic field value being used to determine an amount of current associated with the current passing through the current rail that compensates for the midpoint of the current rail and the midpoint of the first distance between the first primary Hall cell and the second primary Hall cell not being aligned and being separated by the particular distance along the axis.

2. The magnetic current sensor of claim 1, further comprising:
   one or more components to:
     derive a differential Hall signal based on the first magnetic field value and the second magnetic field value;
     derive an auxiliary Hall signal based on the third magnetic field value;
     determine a corrected differential Hall signal based on the differential Hall signal and the auxiliary Hall signal; and
     determine the amount of current, associated with the current passing through the current rail, based on the corrected differential Hall signal.

3. The magnetic current sensor of claim 2, where the one or more components are to:
   determine, based on the differential Hall signal and the auxiliary Hall signal, information that identifies a horizontal positioning error associated with attaching the magnetic current sensor in a position relative to the current rail; and
   store the information that identifies the horizontal positioning error.

4. The magnetic current sensor of claim 2, where the one or more components, when determining the corrected differential Hall signal, are to:
   determine the corrected differential Hall signal based on the differential Hall signal, the auxiliary Hall signal, and a constant associated with the current rail.

5. The magnetic current sensor of claim 2, where the one or more components, when determining the corrected differential Hall signal, are to:
   determine the corrected differential Hall signal $U_{MainComp}$ based on:

$$U_{MainComp} = U_{Main} \cdot \left(1 + \alpha \cdot \left(\frac{S_0 \cdot U_{Aux}}{\beta \cdot U_{Main}}\right)^2\right)$$

where $\alpha$, $\beta$, and $S_0$ represent constants associated with current rail, $U_{Main}$ represents the differential Hall signal, and $U_{Aux}$ represents the auxiliary Hall signal.

6. The magnetic current sensor of claim 1, where the second distance is equal to one-half of the first distance.

7. The magnetic current sensor of claim 1, where the second distance is a distance that is less than one-half of the first distance or the second distance is a distance that is greater than one-half of the first distance.

8. The magnetic current sensor of claim 1, where the current rail is a symmetric current rail and the magnetic current sensor is attached in a position relative to the symmetric current rail.

9. The magnetic current sensor of claim 1, where the particular distance is within a horizontal positioning tolerance associated with attaching the magnetic current sensor in a position relative to the current rail.

10. The magnetic current sensor of claim 1, where the current rail includes an electrically conductive track between two or more electronic components.

11. A method, comprising:
    sensing, by a first primary Hall cell of a magnetic current sensor, a first magnetic field value,
        the first magnetic field value being associated with a magnetic field generated by a current passing through a current rail;
    sensing, by a second primary Hall cell, a second magnetic field value,
        the second magnetic field value being associated with the magnetic field generated by the current passing through the current rail, and
        the second primary Hall cell being positioned along an axis at a first distance from the first primary Hall cell,
            the axis being in a direction substantially perpendicular to the current passing through the current rail, and
            a midpoint of the current rail and a midpoint of the first distance between the first primary Hall cell and the second primary Hall cell not being aligned and being separated by a particular distance along the axis;
    sensing, by an auxiliary Hall cell, a third magnetic field value,
        the auxiliary Hall cell being positioned along the axis at a second distance from the first primary Hall cell, the second distance being less than the first distance such that the auxiliary Hall cell is positioned along the axis and between the first primary Hall cell and the second primary Hall cell; and
        the auxiliary Hall cell being positioned off the midpoint of the current rail; and
    determining, by a processor, an amount of current associated with the current passing through the current rail, based on the first magnetic field value, the second magnetic field value, and the third magnetic field value, that compensates for the midpoint of the current rail and the midpoint of the first distance between the first primary Hall cell and the second primary Hall cell not being aligned and being separated by the particular distance along the axis.

12. The method of claim 11, where determining the amount of current includes:
    deriving a differential Hall signal based on the first magnetic field value and the second magnetic field value;
    deriving an auxiliary Hall signal based on the third magnetic field value;
    determining a corrected differential Hall signal based on the differential Hall signal and the auxiliary Hall signal; and
    determining the amount of current, associated with the current passing through the current rail, based on the corrected differential Hall signal.

13. The method of claim 12, further comprising:
    determining, based on the differential Hall signal and the auxiliary Hall signal, information that identifies a horizontal positioning error associated with attaching the magnetic current sensor in a position relative to the current rail; and
    storing the information that identifies the horizontal positioning error.

14. The method of claim 12, where determining the corrected differential Hall signal includes:
    determining the corrected differential Hall signal based on the differential Hall signal, the auxiliary Hall signal, and a constant associated with the current rail.

15. The method of claim 12, where determining the corrected differential Hall signal includes:
    determining the corrected differential Hall signal $U_{MainComp}$ based on:

$$U_{MainComp} = U_{Main} \cdot \left(1 + \alpha \cdot \left(\frac{S_0 \cdot U_{Aux}}{\beta \cdot U_{Main}}\right)^2\right)$$

where $\alpha$, $\beta$, and $S_0$ represent constants associated with current rail, $U_{Main}$ represents the differential Hall signal, and $U_{Aux}$ represents the auxiliary Hall signal.

16. The method of claim 11, where the second distance is equal to one-half of the first distance.

17. The method of claim 11, where the second distance is a distance that is less than one-half of the first distance or the second distance is a distance that is greater than one-half of the first distance.

18. The method of claim 11, where the current rail is a symmetric current rail and the magnetic current sensor is attached in a position relative to the symmetric current rail.

19. The method of claim 11, where the particular distance is within a horizontal positioning tolerance associated with attaching the magnetic current sensor in a position relative to the current rail.

20. The magnetic current sensor of claim 1, where the auxiliary Hall cell is positioned at the midpoint of the first distance between the first primary Hall cell and the second primary Hall cell.

* * * * *

UNITED STATES PATENT AND TRADEMARK OFFICE
CERTIFICATE OF CORRECTION

PATENT NO. : 10,684,331 B2
APPLICATION NO. : 15/875364
DATED : June 16, 2020
INVENTOR(S) : Akos Hegedus Page 1 of 1

It is certified that error appears in the above-identified patent and that said Letters Patent is hereby corrected as shown below:

In Claim 1, Column 24, Line 10, "the second primary Hall cell, and," should be changed to -- the second primary Hall cell, --.

Signed and Sealed this
Twenty-ninth Day of September, 2020

Andrei Iancu
*Director of the United States Patent and Trademark Office*